(12) United States Patent
Hashimi et al.

(10) Patent No.: US 8,809,919 B2
(45) Date of Patent: Aug. 19, 2014

(54) SEMICONDUCTOR DEVICE WITH INVERTED TRAPEZOIDAL CROSS SECTIONAL PROFILE IN SURFACE AREAS OF SUBSTRATE

(75) Inventors: Kazuo Hashimi, Kawasaki (JP); Hidekazu Sato, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/348,487

(22) Filed: Jan. 11, 2012

(65) Prior Publication Data

US 2012/0104477 A1 May 3, 2012

Related U.S. Application Data

(62) Division of application No. 12/628,899, filed on Dec. 1, 2009, now Pat. No. 8,114,764, which is a division of application No. 11/114,111, filed on Apr. 26, 2005, now Pat. No. 7,642,192.

(30) Foreign Application Priority Data

Jul. 6, 2004 (JP) .................................. 2004-199679
Feb. 18, 2005 (JP) .................................. 2005-042871

(51) Int. Cl.
*H01L 29/76* (2006.01)
*H01L 21/768* (2006.01)
*H01L 21/3065* (2006.01)
*H01L 29/66* (2006.01)
*H01L 21/02* (2006.01)

(52) U.S. Cl.
CPC .... *H01L 29/66636* (2013.01); *H01L 21/76805* (2013.01); *H01L 21/3065* (2013.01); *H01L 21/76802* (2013.01); *H01L 21/76814* (2013.01); *H01L 21/02071* (2013.01); *H01L 21/02063* (2013.01)
USPC ..................... 257/288; 257/327; 257/E29.255

(58) Field of Classification Search
USPC .................. 257/213–412, E29.242, E29.255, 257/E29.273
See application file for complete search history.

(56) References Cited

U.S. PATENT DOCUMENTS 5,350,480 A 9/1994 Gray
(Continued)

FOREIGN PATENT DOCUMENTS

| JP | H09-306867 | 11/1997 |
| JP | H10-209428 | 8/1999 |

(Continued)

OTHER PUBLICATIONS

USPTO, [ISAAC] "U.S. Appl. No. 12/628,899 (parent)," [NOA] Notice of Allowance and Fees Due issued on Oct. 18, 2011 (allowed).

(Continued)

*Primary Examiner* — Tucker Wright
(74) *Attorney, Agent, or Firm* — Fujitsu Patent Center

(57) ABSTRACT

A semiconductor device fabrication method includes the steps of (a) forming a dielectric film on a semiconductor substrate; (b) etching the dielectric film by a dry process; and (c) supplying thermally decomposed atomic hydrogen onto the semiconductor substrate under a prescribed temperature condition, to remove a damaged layer produced in the semiconductor substrate due to the dry process.

4 Claims, 28 Drawing Sheets

(56) References Cited

U.S. PATENT DOCUMENTS

| | | | |
|---|---|---|---|
| 5,916,822 | A | 6/1999 | Goldstein et al. |
| 6,136,698 | A * | 10/2000 | Lu .................................. 438/649 |
| 6,261,965 | B1 | 7/2001 | Sekiyama |
| 6,284,664 | B1 | 9/2001 | Kawai |
| 6,316,322 | B1 | 11/2001 | Hao |
| 6,399,429 | B1 | 6/2002 | Yamoto et al. |
| 6,465,842 | B2 * | 10/2002 | Nishinohara ................. 257/330 |
| 6,511,575 | B1 | 1/2003 | Shindo et al. |
| 6,528,116 | B1 | 3/2003 | Pokharna et al. |
| 6,743,669 | B1 * | 6/2004 | Lin et al. ....................... 438/238 |
| 6,933,243 | B2 | 8/2005 | Shen et al. |
| 7,642,192 | B2 | 1/2010 | Hashimi |
| 2002/0064944 | A1 | 5/2002 | Chung et al. |
| 2002/0177304 | A1 | 11/2002 | Hashimi |
| 2005/0118810 | A1 | 6/2005 | Harada et al. |

FOREIGN PATENT DOCUMENTS

| | | |
|---|---|---|
| JP | 2000-91310 | 3/2000 |
| JP | 2002-289554 | 10/2002 |
| KR | 2001-0023407 | 3/2001 |
| WO | WO 2004-074932 | 9/2004 |

OTHER PUBLICATIONS

USPTO, [ISAAC] "U.S. Appl. No. 12/628,899 (parent)," [CTNF] Non-Final Office Action issued on Mar. 24, 2011 (allowed).
USPTO, [ISAAC] "U.S. Appl. No. 12/628,899 (parent)," [CTRS] Requirement for Restriction/Election issued on Feb. 3, 2011 (allowed).
USPTO, [ISAAC] "U.S. Appl. No. 11/114,111 (grand-parent)," [NOA] Notice of Allowance and Fees Due issued on Sep. 2, 2009 (issued).
USPTO, [ISAAC] "U.S. Appl. No. 11/114,111 (grand-parent)," [CTNF] Non-Final Office Action issued on Dec. 11, 2008 (issued).
USPTO, [ISAAC] "U.S. Appl. No. 11/114,111 (grand-parent)," [CTFR] Final Rejection issued on Jun. 19, 2008 (issued).
USPTO, [ISAAC] "U.S. Appl. No. 11/114,111 (grand-parent)," [CTNF] Non-Final Office Action issued on Oct. 10, 2007 (issued).
USPTO, [ISAAC] "U.S. Appl. No. 11/114,111 (grand-parent)," [CTRS] Requirement for Restriction/Election issued on Jul. 26, 2007 (issued).
Taiwanese Office Action dated Aug. 27, 2008, issued in corresponding Taiwanese Application No. 94113117 along with English translation.
Korean Office Action dated Jun. 29, 2006.
European Search Report dated Nov. 7, 2005.

* cited by examiner

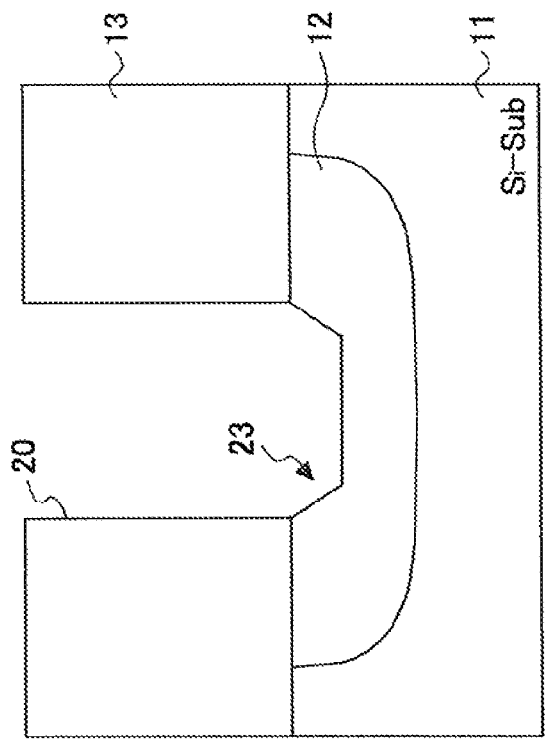
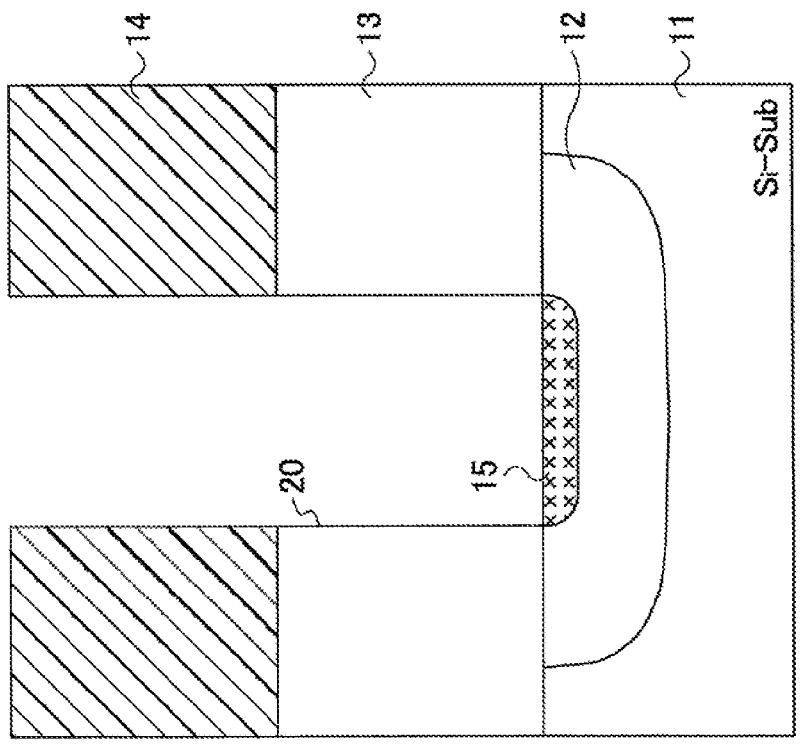

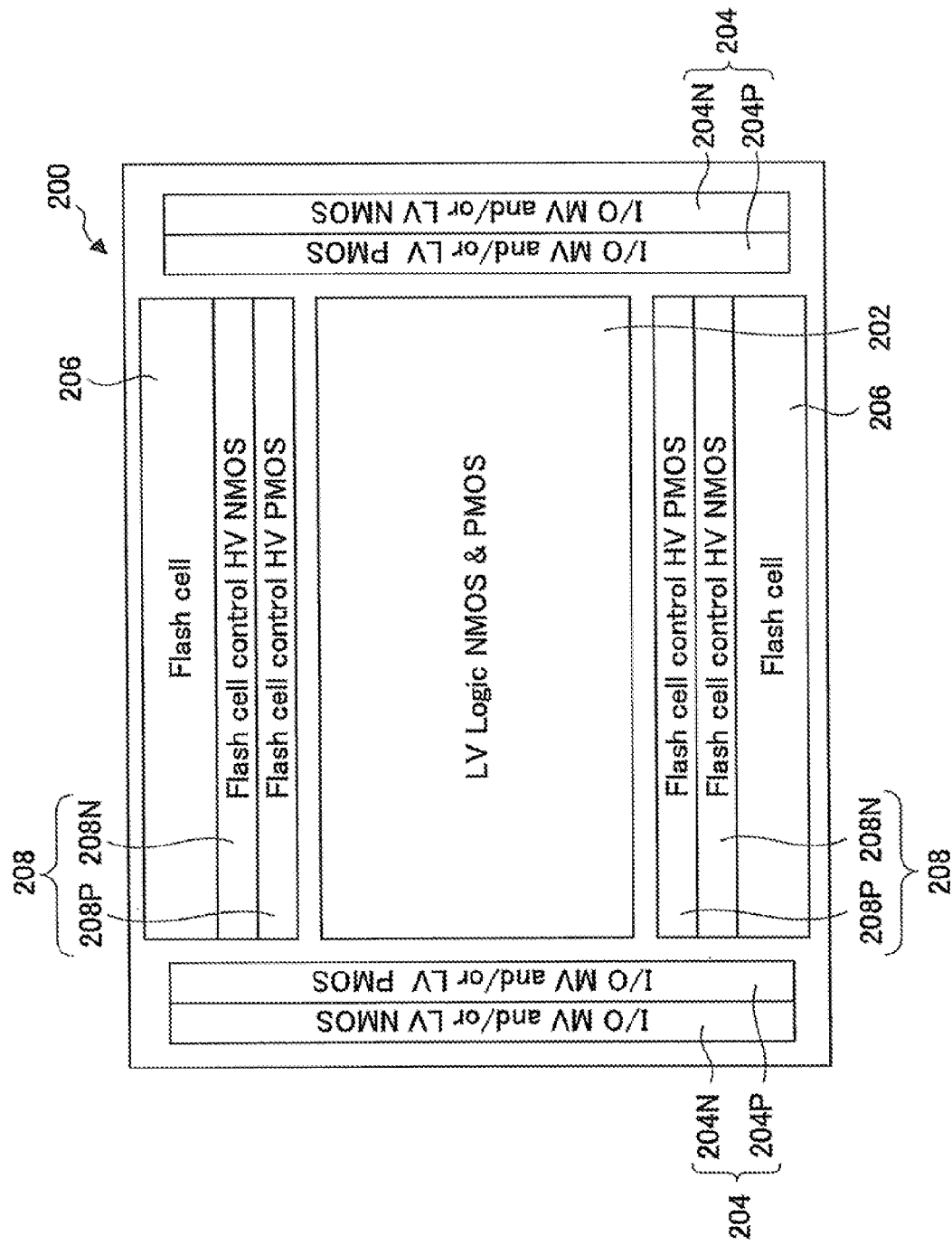

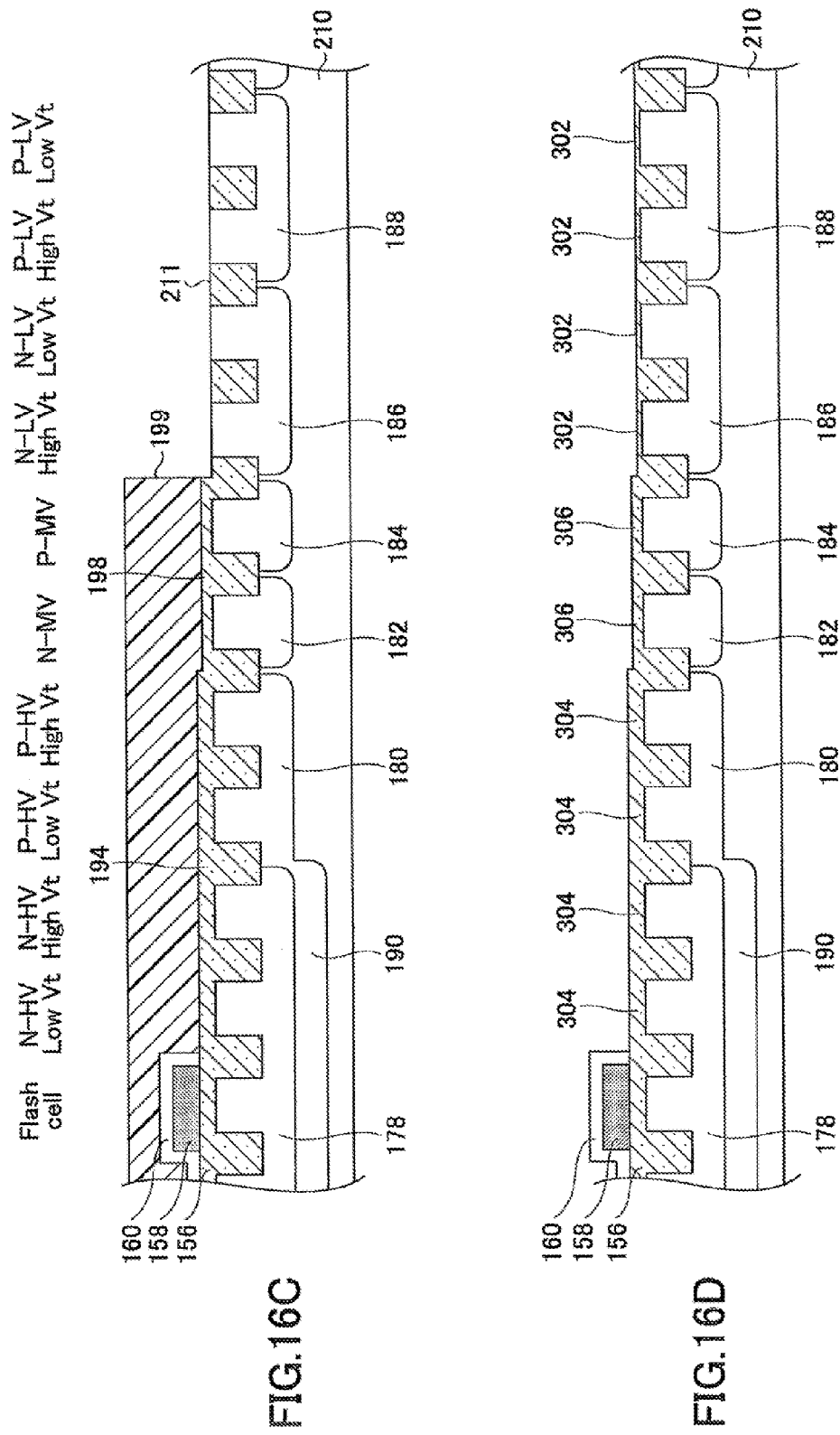

SEMICONDUCTOR DEVICE WITH INVERTED TRAPEZOIDAL CROSS SECTIONAL PROFILE IN SURFACE AREAS OF SUBSTRATE

BACKGROUND OF THE INVENTION

1. Field of the Invention

The present invention generally relates to fabrication of semiconductor devices, and more particularly, to a technique for removing damaged silicon from the contact region between doped silicon and a conductive layer during a fabrication process of semiconductor devices.

2. Description of the Related Art

Along with miniaturization of semiconductor integrated circuits, the aspect ratio of contact holes is increasing, while the depth of impurity-diffused regions in a semiconductor substrate is decreasing. The line and space patterns of gate electrodes are also becoming narrower and minute. Under these circumstances, sufficient areas have to be guaranteed for silicide formation.

In general, contact holes are formed by etching an insulating interlevel dielectric 1003 using a resist pattern 1004 as a mask, as illustrated in FIG. 1A. For example, silicon oxide ($SiO_2$) defining the insulating interlevel dielectric 1003 is etched by plasma etching under fluorocarbon gas supply, until the impurity diffused region 1002 formed in the silicon substrate 1001 is exposed.

To perform plasma etching on the silicon oxide layer 1003, the ion energy in plasma is raised to 1 KeV or higher. To this end, when conducting over-etching on the exposed impurity diffused region 1002 after the removal of the silicon oxide layer 1003, damaged layer 1005 is created in the impurity diffused region 1002 due to ion impact. The damaged layer (or damaged silicon) 1005 is caused by silicon-carbon (Si—C) bonded by carbon ions implanted during the plasma etching. The damaged layer 1005 reaches a depth of 5 nm from the surface of the impurity diffused region 1002.

Such a damaged layer may also be produced by dry etching during the process of side-wall formation. In addition, silicon damage occurs when fabricating gate electrodes, even before impurity injection, mainly due to electromagnetic waves. Damaged layers created during the gate etching will cause the parasitic resistance of the LDD region to be formed in the subsequent process to increase, and undesirable junction leakage will occur.

To prevent damage in the impurity diffused region 1002, it is proposed to reduce the ion energy in plasma to or below 0.5 KeV from 1 KeV. Silicon oxide can be etched at the ion energy of about 0.5 KeV, and the depth of the damaged layer 1005 can be reduced.

However, if the ion energy is lowered, the etching selectivity of the silicon oxide layer 1003 with respect to the silicon substrate 1001 also falls. As a result, the silicon substrate 1001 is etched excessively, at depth of 50 nm or more, as illustrated in FIG. 1B. In the present state of the technology in which the impurity diffused region 1002 is designed to be shallower along with the miniaturization of the device scale, excess etch 1006 due to degraded etching selectivity is a serious problem. Accordingly, lowering the ion energy to prevent generation of damaged layers is impractical.

Since the damaged layer 1005 existing at the surface of the impurity diffused region 1002 has a high resistance, leading to increased contact resistance, the damaged layer 1005 has to be removed. To remove the damaged layer 1005, isotropic etching using a fluorine radical, such as CF4 or SF6, is employed conventionally. With isotropic etching, undercut 1009 is generated at the bottom of the contact hole 1020, as illustrated in FIG. 2A. If a titanium (Ti) or titanium nitride (TiN) barrier metal layer 1007 is formed in the contact hole 1020, the contact hole 1020 cannot be completely covered with the barrier metal layer 1007 with discontinuity occurring at the undercut 1009, as illustrated in FIG. 2B. In this state, when the contact hole 1020 covered with a defective barrier metal 1007 is filled with a metal 1010, such as tungsten (W), the metal reacts with silicon at the break in the barrier metal 1007. As a result, metal silicide 1008 is produced abnormally at the undercut 1009, and junction leakage current increases.

JP 2000-91310A (Publication 1) discloses a method for removing such a damaged layer by etching the substrate with hydrogen plasma under the condition of hydrogen gas ratio at or above 80%, the amount of gas flow at or above 50 SCCM, and pressure at or above 50 mTorr.

JP 10-209428A (Publication 2) discloses a technique for increasing the boundary area size between a semiconductor substrate and a conductive film in order to decrease the contact resistance. With this technique, V-shaped grooves or tapered grooves (with an inverted trapezoidal cross-section) are formed in the (111) or (100) plane of the substrate exposed at the bottom of the contact hole by anisotropic etching. By forming grooves at the bottom of the contact hole, the contact area size is increased.

JP 2002-289554A (Publication 3) discloses a technique for introducing a metallic element with activation energy for silicidation of 1.8 eV or lower into storage electrodes at a prescribed density, in order to reduce leakage current and to improve the refresh characteristic of a DRAM. Examples of metallic atoms with silicidation activation energy at or below 1.8 eV include titanium (Ti), nickel (Ni), cobalt (Co), and platinum (Pt). By positively introducing a metal that easily reacts with silicon for silicidation into the silicon substrate, gettering sites are produced, and DRAM leakage current can be reduced.

However, no temperature control is conducted in Publication 1 (2000-91310A), and accordingly, the surface shape of the substrate should become isotropic after the removal of the damaged layer. This means that occurrence of undercut cannot be prevented, and contact resistance cannot be reduced efficiently.

The method proposed in Publication 2 (10-209428A) is applicable only to structures having sufficiently wide contact areas. This method is unsuitable for removal of damaged layers from the bottom of contact holes with a high-aspect ratio.

In Publication 3 (2002-289554), a metal element is introduced to the substrate in a oxide-film etching chamber. Accordingly, if a number of wafers are processed, the amount of metal element to be introduced is likely to fluctuate. This is because the injection amount of the metal to be introduced varies due to the influence of organic products generated during the etching process of the oxide film.

SUMMARY OF THE INVENTION

The present invention was conceived to overcome the above-described problems in the prior art, and it is an object of the present invention to provide a semiconductor device fabrication method capable of removing damaged layers, without causing undercut, even in high-aspect-ratio contact holes.

It is another object of the invention to provide a semiconductor device fabrication method that can prevent leakage current at contact portions by introducing a metal element in silicon substrates in a stable manner.

It is still another object of the invention to provide a semiconductor device fabrication method capable of removing damaged layers produced after formation of gate electrodes or side wall etching to reduce parasitic resistance or junction leakage.

It is yet another object of the invention to provide a semiconductor device that has an increased area for silicide formation with low resistance.

To achieve the above-described objects, silicon damage produced in silicon substrates or polysilicon plugs due to dry etching is removed by atomic hydrogen generated by thermal decomposition (pyrolysis) under a prescribed temperature condition. By etching the wafer using atomic hydrogen under a prescribed temperature condition, the damaged layer can be removed in an anisotropic shape, without causing undesirable undercut.

In addition, a metal catalyst containing a metal with silicidation activation energy at or below 1.8 eV is used to produce pyrolytic hydrogen, in order to supply a stable amount of metal onto the semiconductor substrate making use of evaporation from the metal catalyst. Consequently, junction leakage current can be reduced.

To be more precise, in one aspect of the invention, a semiconductor device fabrication method includes the steps of:
(a) forming a dielectric film on a semiconductor substrate;
(b) etching the dielectric film by a dry process; and
(c) supplying thermally decomposed atomic hydrogen onto the semiconductor substrate under a prescribed temperature condition, to remove a damaged layer produced in the semiconductor substrate due to the dry process.

Atomic hydrogen may be generated by, for example, introducing a molecule containing hydrogen (such as hydrogen gas) and bringing it into contact with a heated catalyst to thermally decompose the molecule.

In a preferable example, the damaged layer is removed, while the temperature of the susceptor for holding the semiconductor substrate is maintained at or above 170° C.

In a preferred example, the catalyst includes a metal with silicidation activation energy at or below 1.8 eV. In this case, the method further includes the step of introducing the metal in the semiconductor substrate.

With this arrangement, a prescribed amount of metal can be introduced into the semiconductor substrate in a stable manner.

In the second aspect of the invention, a semiconductor device fabrication method includes the steps of:
(a) forming a dielectric film on a semiconductor substrate;
(b) forming a conductive layer on the dielectric film;
(c) patterning the conductive layer by a dry process to form an electrode; and
(d) removing at least a portion of a damaged layer produced in the semiconductor substrate due to the dry process, after at least a portion of the dielectric film is removed, using thermally decomposed atomic hydrogen under a prescribed temperature condition.

In the third aspect of the invention, a semiconductor device fabrication method includes the steps of:
(a) forming a gate electrode on a semiconductor substrate via a dielectric film;
(b) forming a sidewall for the gate electrode by dry etching; and
(c) removing a damaged layer produced in the semiconductor substrate due to the formation of the sidewall, by means of thermally decomposed atomic hydrogen under a prescribed temperature condition.

In either method, the damaged layer can be removed in a tapered shape with an inverted trapezoid cross-section, without causing undercut, by processing the substrate using thermally decomposed atomic hydrogen (hydrogen radical) under a prescribed temperature condition. Consequently, parasitic resistance and junction leakage are reduced.

In the fourth aspect of the invention, a semiconductor device with less parasitic resistance and junction leakage is provided. The semiconductor device comprises a semiconductor substrate, a gate electrode positioned on the semiconductor substrate via a dielectric film, a sidewall covering side walls of the gate electrode, and an impurity diffused region formed in the semiconductor substrate and extending on both sides of the gate electrode, wherein the bottom of the side wall is shaped with an inverted trapezoidal cross-section, and the surface of the impurity diffused region extending outside the sidewall is shaped with an inverted trapezoidal cross-section.

By arranging the cross-sectional shape of the surface area of the impurity diffused region to be inverted trapezoidal, without undercut, the silicidation area is expanded, and a semiconductor device with reduced junction leakage and resistance can be realized.

BRIEF DESCRIPTION OF THE DRAWINGS

Other objects, features, and advantages of the present invention will become more apparent from the following detailed description when read in conjunction with the accompanying drawings, in which:

FIG. 3A and FIG. 3B are schematic diagrams illustrating removal of a damaged layer according to the first embodiment of the present invention;

FIG. 15A and FIG. 15B are schematic diagrams illustrating a semiconductor device in a plan view and a cross-sectional view, respectively, according to the fourth embodiment of the invention; and FIG. 16A through FIG. 16M illustrate a fabrication process of the semiconductor device shown in FIG. 15.

DETAILED DESCRIPTION OF THE PREFERRED EMBODIMENTS

Figure 1B:
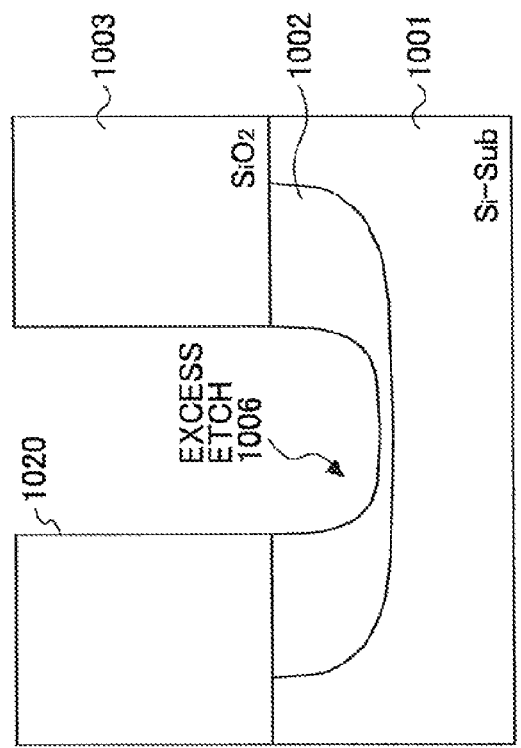
FIG. 1A and FIG. 1B are schematic diagrams illustrating a problem in a conventional method for removing a damaged layer produced by contact hole etching.
Figure 1A:
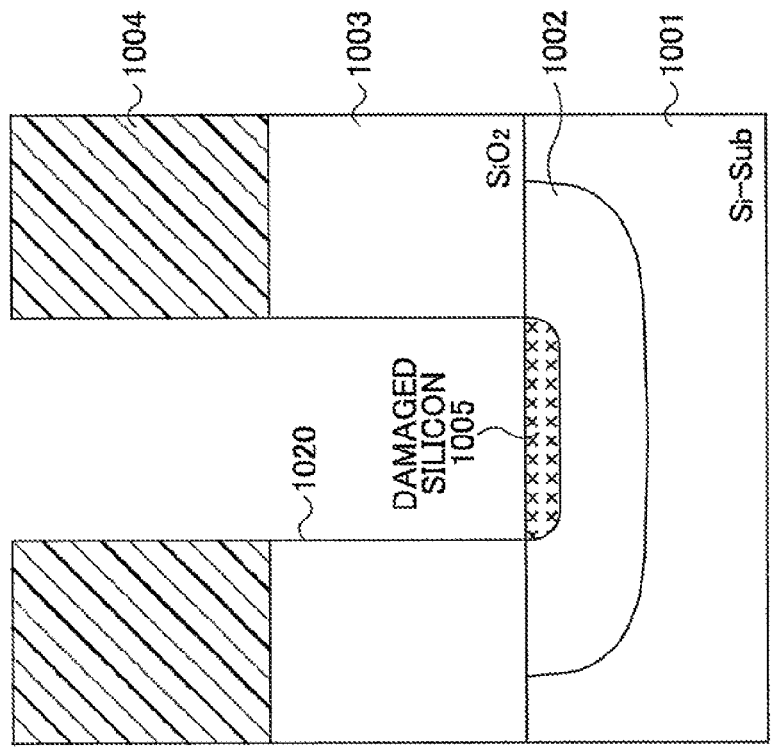

The preferred embodiments of the present invention are now described with reference to the attached drawings.

The first embodiment of the present invention is explained in conjunction with FIG. 3 through FIG. 6. In the first embodiment, a damaged layer produced in a silicon substrate due to dry etching of a dielectric film is removed using thermally decomposed atomic hydrogen, in a wafer processing chamber with a heated catalyst, during a semiconductor device fabrication process. In the following, the removal of the damaged layer is explained based on an example in which the damaged layer is produced at the bottom of a contact hole when dry-etching the insulating interlevel dielectric to form the contact hole.

FIG. 3A and FIG. 3B are schematic diagrams illustrating the basic idea of the removal of a damaged layer. In FIG. 3A, a contact hole 20 is formed in a sample for measurement of contact resistance. An n-type impurity diffused region 12 is formed in a prescribed area of a p-type silicon substrate (10Ω) 11. In fabricating the sample, the n-type impurity diffused region 12 is formed by, for example, injecting arsenic (As) ions of $4E15/cm^2$ at injection energy of 30 KeV.

Then, a silicon oxide film 13 with a thickness of 50 nm is formed by chemical vapor deposition (CVD). A resist pattern 14 with an opening of a diameter of 0.4 μm is formed on the silicon oxide film 13 using photolithography. This wafer is placed in an oxide film etcher to form the contact hole 20 in the silicon oxide film 13 using the resist pattern 14 as a mask.

The oxide film etcher is, for example, a parallel-plate etcher to perform a plasma process at discharging frequency of 380 kHz. The gas species used in the etching include $CHF_3$, $CF_4$, and Ar. The ion energy in plasma under these etching conditions is 1.2 KeV.

The silicon oxide film 13 is etched by 50 nm. When the impurity diffused region 12 is exposed, the damage layer 15 reaches a depth of 5 nm from the surface of the impurity diffused region 12. The damaged layer 15 contains implanted carbon ions, which generate silicon-carbon (Si—C) bonding in the impurity diffused region 12. It Is considered that the Si—C bond causes the contact resistance to increase.

Then, the damaged layer 15 is removed from the bottom of the contact hole 20, as illustrated in FIG. 3B. Prior to removing the damaged layer 15, the wafer with the contact hole 20 is moved into a wafer processing apparatus furnished with a heated catalyst. In the processing chamber, atomic hydrogen is generated by thermal decomposition using the catalyst to etch the damaged layer 15 in the gas phase.

Figure 4:
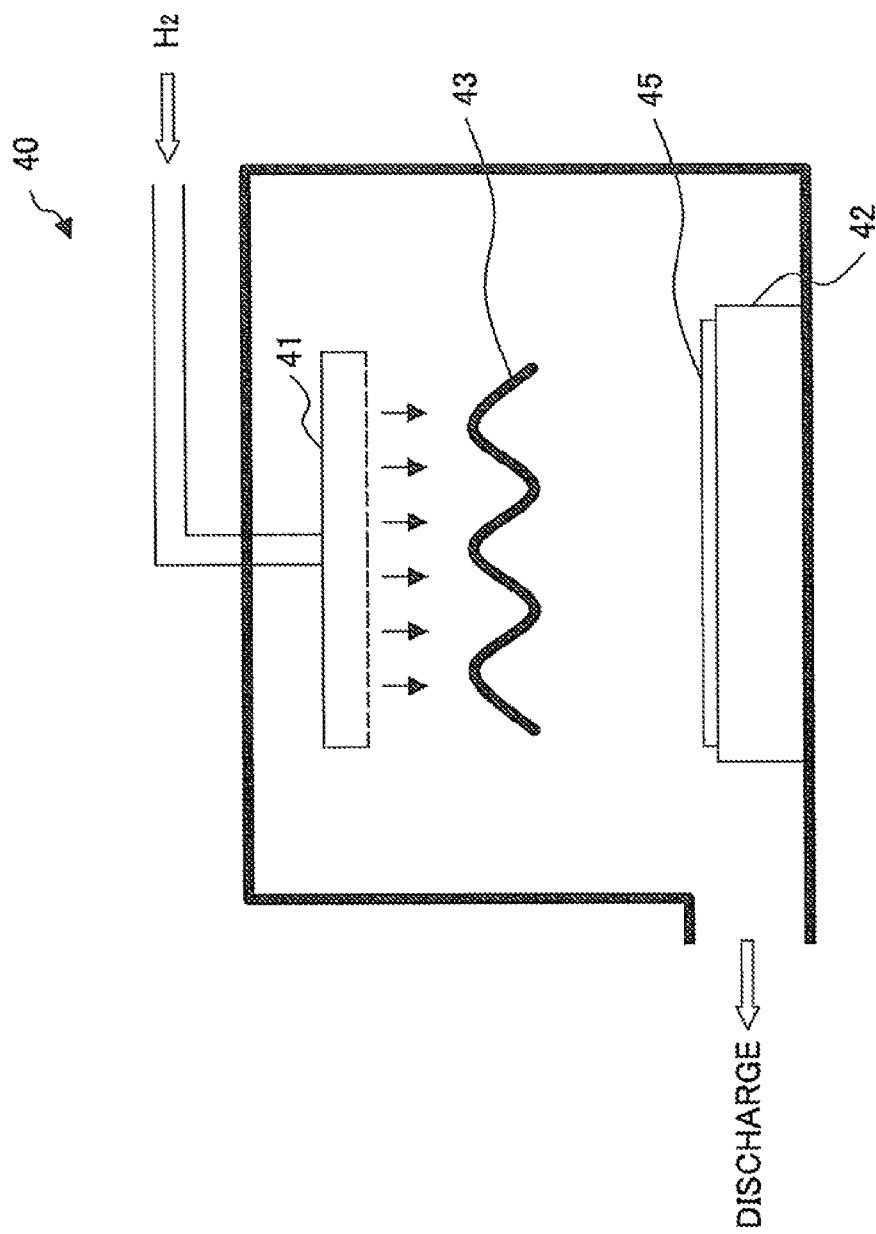
FIG. 4 is a schematic diagram illustrating a wafer processing apparatus with a heated catalyst used to remove a damaged layer according to the first embodiment of the invention.

FIG. 4 is a schematic diagram illustrating an example of the wafer processing apparatus 40 furnished with a heated catalyst 43. The processing apparatus 40 includes a gas supply port 41 for introducing hydrogen gas into the chamber, a stage 42 for holding the wafer (silicon substrate with contact holes) 45, and the catalyst 43. In the first embodiment, tungsten filament 43 is heated to 1800° C. in advance, and hydrogen gas is supplied through the gas supply port 41 at gas flow of 120 SCCM. The hydrogen molecules come into contact with the heated tungsten filament 43, and are thermally decomposed into atomic hydrogen. The thermally decomposed atomic hydrogen reacts with the silicon substrate (wafer) 45 placed on the stage 42, and the impurity diffused region 12 in the semiconductor substrate is etched about 8 nm under pressure of 1.33 Pa.

Figure 2B:
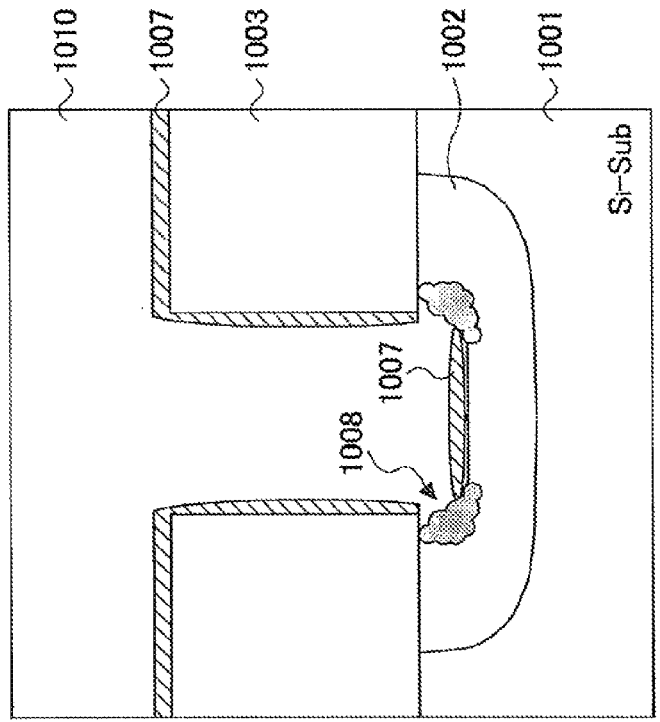
FIG. 2A and FIG. 2B are schematic diagrams illustrating another problem arising when removing a damaged layer using a conventional technique.
Figure 2A:
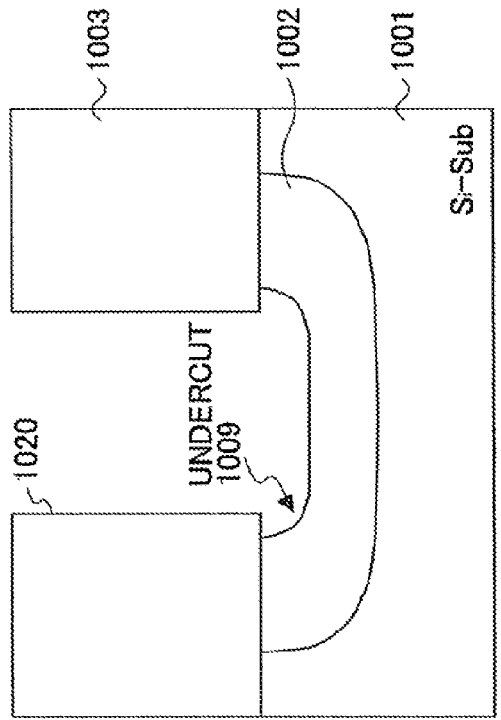

The shape of the substrate surface after the damaged layer 15 has been removed depends on the temperature of the wafer 45. When the wafer 45 is processed at or above 170° C., the cross section of the etched portion becomes an anisotropic shape, as illustrated in FIG. 3B, and a recess 23 with an inverted trapezoidal cross section is generated at the bottom of the contact hole 20. If the wafer temperature is below 170° C., a recess with isotropic undercut shown in FIG. 2A is generated at the etched portion. Such an isotropic shape causes the contact resistance to increase.

Thus, the temperature of the wafer 45 is at or above 170° C. and below the impurity diffusion temperature. Preferably, the wafer temperature is in the range of 300° C. to 500° C.

In the example shown in FIG. 4, the temperature of the stage 42 is maintained at 420° C., which temperature can be regarded as the susceptor temperature for the wafer 45. After the damaged layer 15 is removed by 8 nm at 420° C., a clear vision of an inverted trapezoidal cross section is observed by SEM observation. Such a tapered cross-section of the recess 23 relates to the dependency of the etching rate of the silicon substrate on the crystal plane orientation.

Figure 5:
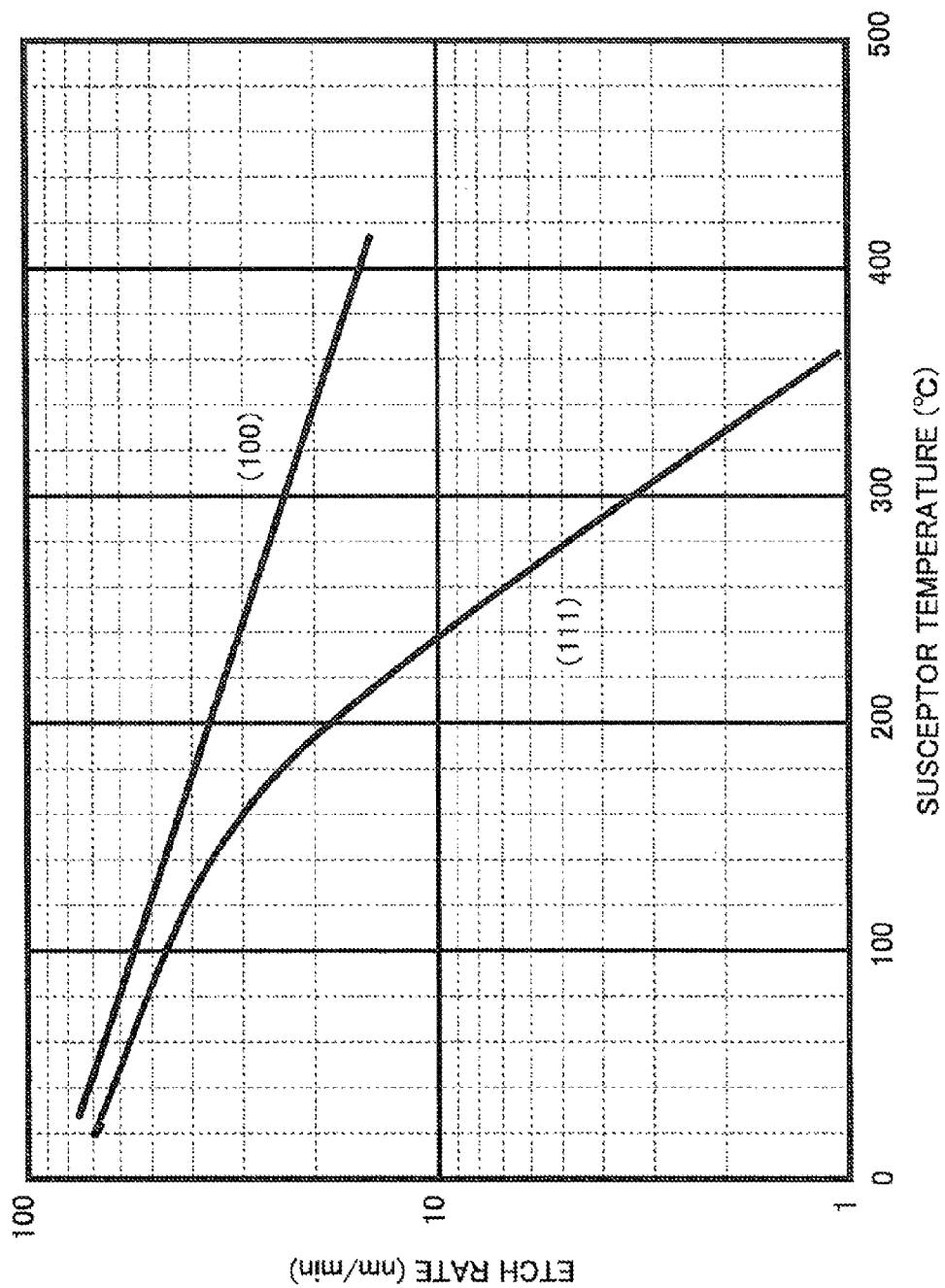
FIG. 5 is a chart of etching rate as a function of susceptor temperature, showing dependency on crystal plane orientation.

FIG. 5 is a chart of etching rate of a silicon substrate as a function of susceptor temperature at (100) plane and (111) plane. The etching rate on the (111) plane abruptly falls around 170° C., and accordingly, the (100) plane is etched dominantly at or above 170° C., and especially at or above 200° C.

In contrast, in the range below 170° C., the etching rate is almost the same on the (111) plane and (100) plane, and accordingly, the shape of the etched portion becomes the isotropic one, as in the conventional isotropic etching using a fluorine radical. With this temperature range, increase of contact resistance cannot be prevented effectively.

The mechanism of the crystal-orientation dependency of silicon etching rate is considered as follows. Silicon atoms at the surface of the (100) plane are fixed by two bonding hands, while silicon atoms at the surface of the (111) plane are fixed by three bonding hands. The more the bonding hands, the higher is the energy required for dissociation of silicon bond. In addition, as the temperature of the substrate surface increases, adsorption time of hydrogen at the surface of the substrate becomes shorter, and accordingly, a sufficient amount of energy cannot be received at the (111) plane. As a result, the etching selectivity between (100) plane and (111) plane increases at a higher temperature, and the damaged layer can be removed with a tapered or an anisotropic profile, without causing undercut.

Figure 6A:
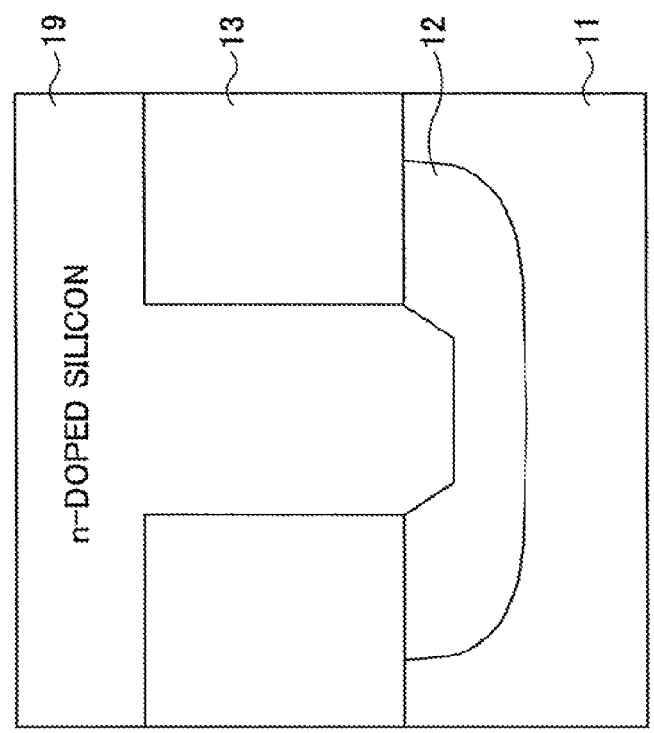
FIG. 6A and FIG. 6B are schematic diagrams illustrating contact holes filled with doped silicon and metal, respectively, after removal of the damaged layers.
Figure 6B:
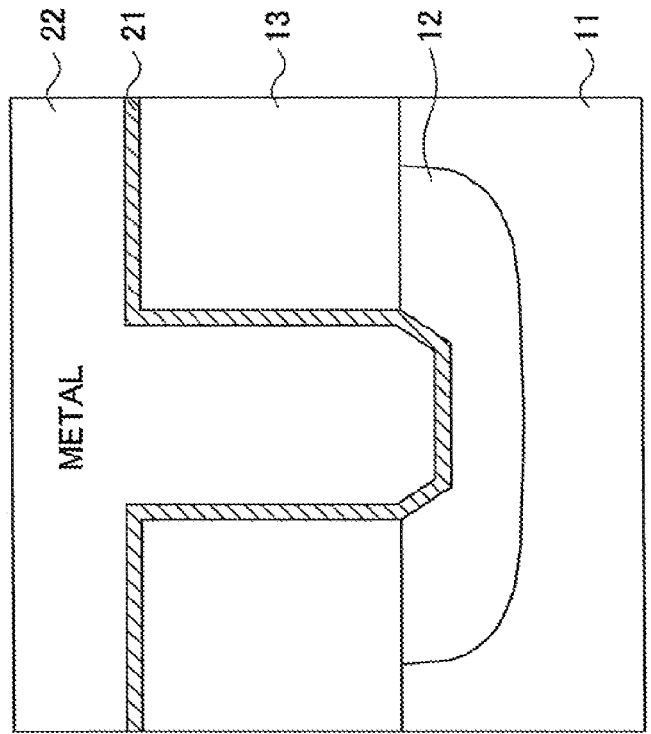

FIG. 6A and FIG. 6B are schematic diagrams illustrating the process of filling the contact hole 20 after the removal of the damaged layer 15. In FIG. 6A, an n-type doped polysilicon film 19 is deposited to fill the contact hole 20. In FIG. 6B, a barrier metal 21 is formed in the contact hole 20, and then, a metallic layer 22 is formed to fill the contact hole 20. The structures shown in FIG. 6A and FIG. 6B are applied to a bitline contact or a contact plug for electrically connecting a capacitor and a transistor.

Then, electrodes and other necessary components are formed on the sample shown in FIG. 6A to measure contact resistance. In addition, two other types of samples are prepared for comparison. One of the comparative samples is prepared by forming an n-type doped polysilicon contact without removing the damaged layer 15 (Comparative Sample 1). The other sample is prepared by forming an n-type doped polysilicon contact after the damaged layer is removed using the conventional isotropic etching (Comparative Sample 2). The contact resistance is also measured using these two comparative samples. The measurement results are shown in Table 1.

| SAMPLE TYPE | COMPARATIVE SAMPLE 1 | COMPARATIVE SAMPLE 2 | SAMPLE OF 1st embodiment |
|---|---|---|---|
| CONTACT RESISTANCE | 200 Ω | 60 Ω | 40 Ω |

As is clearly shown in Table 1, when removing the damaged layer using thermally decomposed atomic hydrogen in the prescribed temperature range, the contact resistance is reduced effectively. In contrast, without removing the damaged layer (Comparative Sample 1), increase of contact resistance is conspicuous due to the silicon-carbon bond formed at the surface of the impurity diffused region. Employing the conventional method for removing the damaged layer by isotropic etching with a fluorine radical, the contact resistance reducing effect is insufficient due to generation of undercut.

In general, it is known that a contact hole is plugged up relatively satisfactorily by polysilicon growth even if undercut is generated at the bottom of the hole. However, generation of voids cannot be prevented completely at or near the area from which the damaged layer has been removed. For this reason, the contact resistance reduction effect is inadequate.

In contrast, with the method of the first embodiment, the damaged layer is removed so as to leave the anisotropic cross-sectional profile, as illustrated in FIG. 6A, and polysilicon is grown in the contact hole without causing voids generated in the hole.

In this manner, the damaged layer removing method of the first embodiment exhibits satisfactory effect of reducing the contact resistance even with polysilicon contact having relatively good coverage. If a silicon-metal contact shown in FIG. 6B is formed, the contact resistance reducing effect can be further increased, as compared with the conventional method.

Although the removal of the damage layer has been explained using an example of formation of a bitline contact or a contact plug with a storage node, the invention is applicable to removal of an arbitrary damaged layer due to an etching gas, for example, removal of a damaged layer produced by sidewall etching.

In general, sidewall etching is conducted after formation of isolations and gate electrodes in a semiconductor device fabrication process. When conducting sidewall etching, the silicon substrate is exposed, and a damaged layer is produced in the exposed silicon surface due to the sidewall etching. Such a damage layer can also be removed by thermally decomposed atomic hydrogen under a prescribed temperature condition. In this case, the removed portion becomes a tapered or anisotropic cross-sectional shape. As a result, undesirable defects in silicide formation can be prevented effectively in the subsequent process. In addition, since a good-conditioned silicon surface is provided after the removal of the damaged layer caused by the sidewall etching, epitaxial growth of silicon germanium is performed appropriately.

Next, the second embodiment of the present invention is described. In the second embodiment, a metal is introduced in the impurity diffused region at or after the removal of the damaged layer, using a wafer processing apparatus 40 shown in FIG. 4. In this case, the heated catalyst 43 used in the processing apparatus 40 is a metallic filament containing titanium. The silicidation activation energy of titanium is at or below 1.8 eV, and it is easy to cause the titanium to react with silicon for silicidation and to form a gettering site.

First, a sample shown in FIG. 3A is placed onto the stage 42 in the processing apparatus 40. The stage temperature (susceptor temperature) and the pressure are set to 420° C. and 1.33 Pa, respectively. The heated catalyst 43 containing titanium is heated to 1900° C. in advance. When hydrogen molecules supplied from the gas supply port 41 come into contact with the heated catalyst 43, thermally decomposed atomic hydrogen is generated. The thermally decomposed hydrogen reacts with silicon and etches the silicon surface. At the same time, titanium particles evaporated from the heated catalyst 43 are introduced in the silicon substrate (wafer) 45. In this state, the damaged layer 15 is removed by about 8 nm.

Since the removal of the damaged layer from and the introduction of a metal to the substrate are performed in the processing apparatus 40 separate from the oxide film etching chamber, the influence of organic products generated by the oxide etching can be excluded. Accordingly, the amount of titanium introduced in the silicon substrate can be controlled in a stable manner even if a number of wafers are processed. If metal is introduced in the silicon substrate simultaneously with removal of the damaged layer, the amount of metal to be introduced in the substrate is determined taking into account the metal remaining at or near the surface from which the damaged layer has been removed. The amount of metal to be introduced is determined based on the competitive reaction between removal of the damaged silicon and introduction of evaporated metal particles. Once the amount is determined, a stable amount of evaporated metal particles are introduced in the substrate with little fluctuation.

In the above-described example, titanium is introduced in the substrate simultaneously with the removal of the damaged layer using thermally decomposed atomic hydrogen. However, introduction of metal may be carried out successively after the removal of the damaged layer in the same processing apparatus. In this case, hydrogen gas supply is stopped when the damaged layer is removed. Then, inert gas, such as helium (He) or argon (Ar), is supplied from the gas supply port 41 to supply titanium from the heated catalyst 43 to the substrate 45. With this method, the processing time becomes longer, as compared with the simultaneous processing; however, the controllability of the metal introduction to the substrate is further improved.

Whether to introduce metal simultaneously with or after removal of the damaged layer can be selectively determined depending on the operational characteristic required for the device. In either case, the density of the metal element introduced in the silicon substrate is controlled in the range of $1 \times 10^{11}$ atoms/cm$^2$ to $1 \times 10^{15}$ atoms/cm$^2$.

Figure 7:
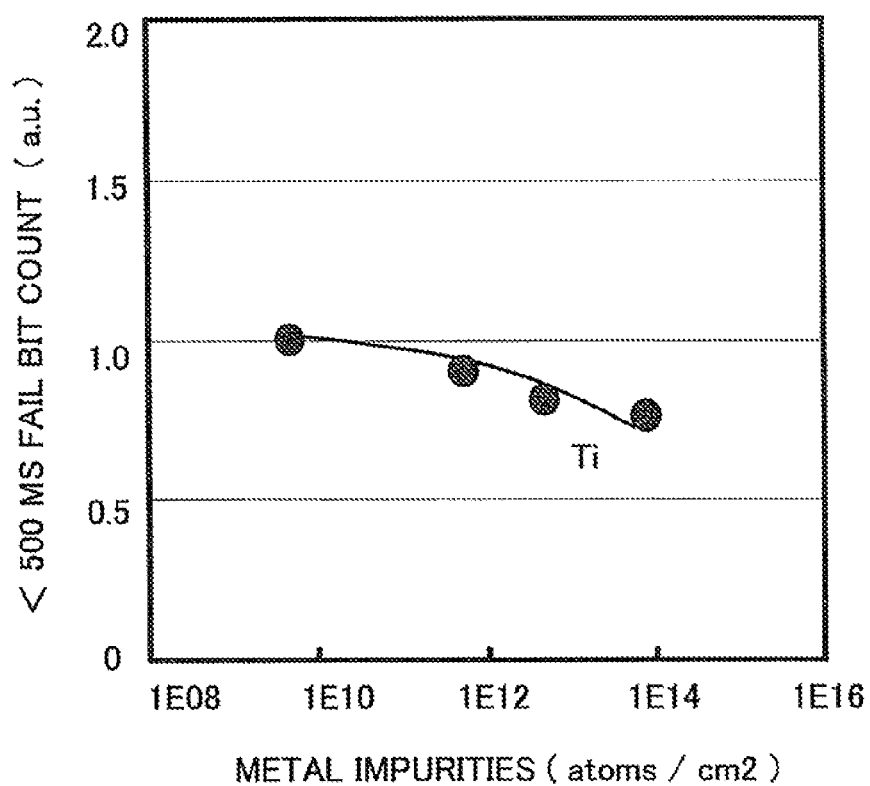
FIG. 7 is a chart of fail bit of a device as a function of titanium density introduced in the semiconductor substrate according to the second embodiment of the invention.

FIG. 7 is a chart showing the relation between the fail bit and the titanium density introduced in the silicon substrate. Prior to the measurement, titanium is introduced in the silicon substrate simultaneously with or successively after the removal of the damaged layer. Then, the contact hole 20 is filled with polysilicon to form a contact plug, as illustrated in FIG. 6A. The polysilicon film 19 over the silicon oxide film 13 is patterned into a storage electrode (not shown) to form a capacitor with a dielectric film (not shown) and an upper electrode (not shown) deposited on the storage electrode. Then, fail bit is counted. In this example, a bit losing a charge within 500 ms is counted as a fail bit.

As is clearly shown in FIG. 7, the fail bit count is reduced by introducing a prescribed amount of titanium in the impurity diffused region of the silicon substrate. This is because the titanium reacts with silicon in the silicon substrate to form a gettering site and prevents leakage current.

By combining the removal of the damaged layer described in the first embodiment with the metal introduction described in the second embodiment, a high-quality contact plug with less contact resistance and reduced leakage current can be realized.

FIG. 8A through FIG. 8G illustrate an example of the semiconductor device fabrication process incorporating the removal of the damaged layer (and metal introduction as necessary).

Figure 8A:
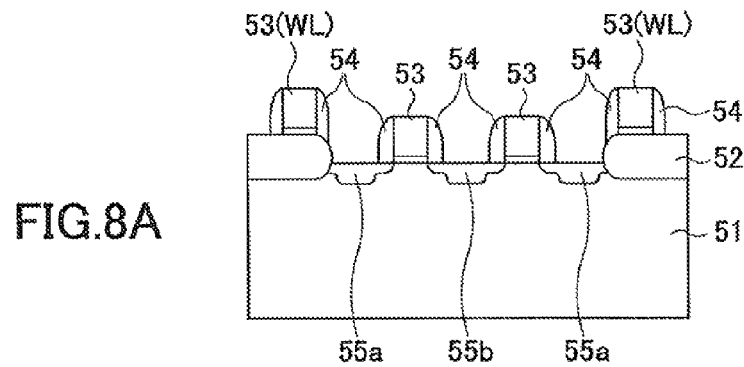
FIG. 8A through FIG. 8G illustrate a semiconductor device fabrication process/including a damaged layer removing step, according to an embodiment of the invention.

First, as illustrated in FIG. 8A, field oxide isolation 52 is formed in a p-type silicon substrate 51, and a gate electrode (or a word line) 53 of a prescribed pattern is formed. Using the gate electrode 53 and the field oxide isolation 52 as a mask, a low-density n-type impurity is injected in the silicon substrate 51. Then, the silicon oxide film is deposited over the entire surface of the substrate 51, and is etched in the perpendicular direction (i.e., anisotropically) to form a sidewall 54. If necessary, the silicon substrate 51 is placed in the processing apparatus shown in FIG. 4 to remove the damaged layer by thermally decomposed atomic hydrogen after the sidewall etching. In the same processing apparatus, a refractory metal with a high melting point and a silicidation energy at or below 1.8 eV may be introduced from the heated catalyst into the silicon substrate 51. Examples of such a metal include titanium (Ti), platinum (Pt), cobalt (Co), and nickel (Ni). Using the sidewall 54 as a mask, a high-density n-type impurity is injected in the silicon substrate 51 to form impurity diffused regions 55a and 55b having an LDD structure.

Figure 8B:
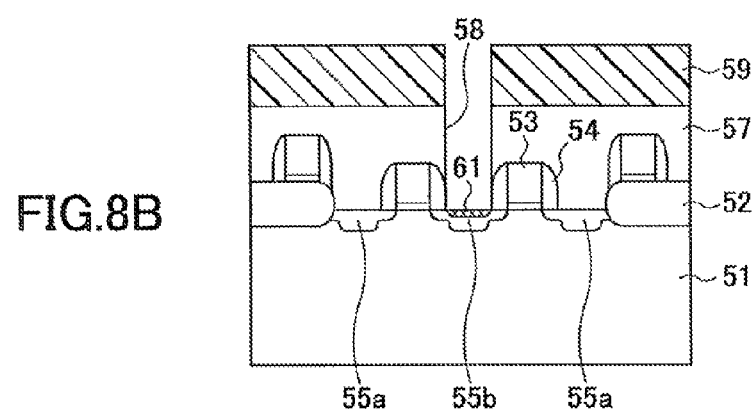

Then, as illustrated in FIG. 8B, a dielectric film (including silicon oxide and interlevel dielectric) 57 is deposited over the entire surface of the silicon substrate. A resist pattern 59 with a prescribed aperture pattern is formed on the dielectric film 57, and a contact hole 58 is formed in the dielectric film 57 by plasma etching, using the resist pattern 59 as the mask, until the impurity diffused region 55b is exposed. Due to the plasma etching, a damaged layer 61 is produced at or near the surface of the impurity diffused region 55b.

Figure 8C:
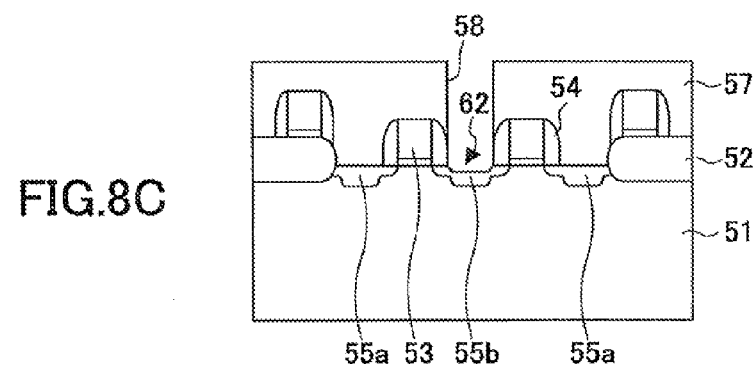

Then, as illustrated in FIG. 8C, the silicon wafer is moved into the processing apparatus with a heated catalyst. The catalyst is heated to 1800° C. in advance, the pressure in the chamber is set to 1.33 Pa, and the susceptor temperature is set to 420° C. Under these conditions, hydrogen gas is supplied into the chamber to remove the damaged layer 61 by thermally decomposed atomic hydrogen. After the removal of the damaged layer 61, a recess 62 with an anisotroopic (or inverted trapezoidal) cross-section is formed at the bottom of the contact hole 58. Metal, such as titanium (Ti), platinum (Pt), cobalt (Co), or nickel (Ni), may be introduced in the silicon substrate 51 from the heated catalyst, as necessary. After the removal of the damaged layer 61, the resist pattern 59 is removed.

Figure 8D:
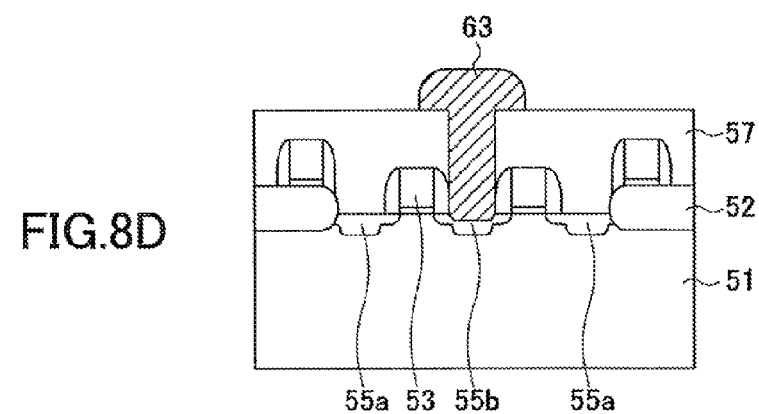

Then, as illustrated in FIG. 8D, n-doped polysilicon film is grown in the contact hole 58 and on the dielectric film 57, and patterned into a prescribed shape to form a bitline contact 63 reaching the impurity diffused region 55b.

Figure 8E:
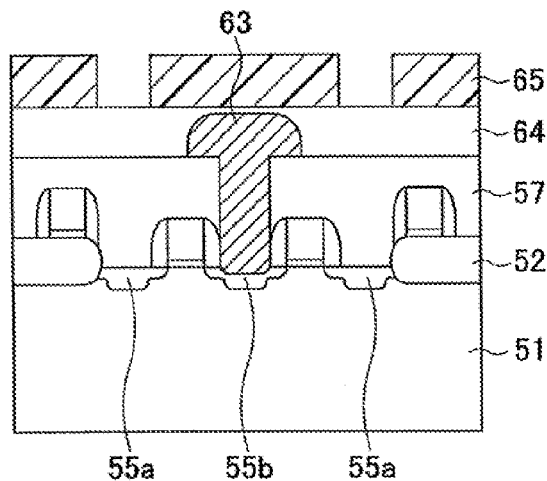

Then, as illustrated in FIG. 8E, interlevel dielectric film 64, such as silicon oxide, is formed over the entire surface, and a resist pattern 65 is formed on the interlevel dielectric film 64.

Figure 8F:
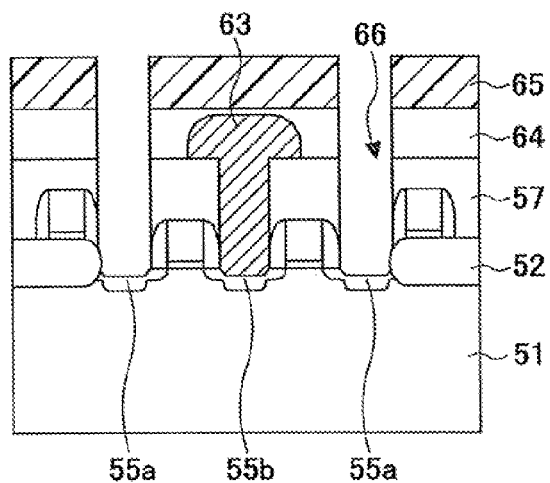

Then, as illustrated in FIG. 8F, plasma etching is performed using the resist pattern 65 as the mask to successively etch the interlevel dielectric film 64 and the dielectric film 57 (including silicon oxide film), so as to form a contact hole 66 reaching the impurity diffused region 55a.

The silicon wafer is then moved into a processing apparatus with a heated catalyst containing titanium (Ti). In this case, the catalyst is heated to 1800° C. in advance, the susceptor temperature is set to 420° C., and the pressure in the chamber is set to 1.33 Pa. Hydrogen gas is supplied into the chamber to remove the damaged layer (not shown) produced by the plasma etching at the bottom of the contact hole 66, making use of thermally decomposed atomic hydrogen. At the same time, titanium is introduced into the impurity diffused region 55a from the heated catalyst. After the removal of the damaged layer, the bottom of the contact hole 66 is shaped so as to have an inverted trapezoidal cross section. Thus, the contacting area is increased, and the contact resistance is reduced. At this point in time, the impurity diffused region 55a contains titanium of $1 \times 10^{19}$ atoms/cm$^2$.

Figure 8G:
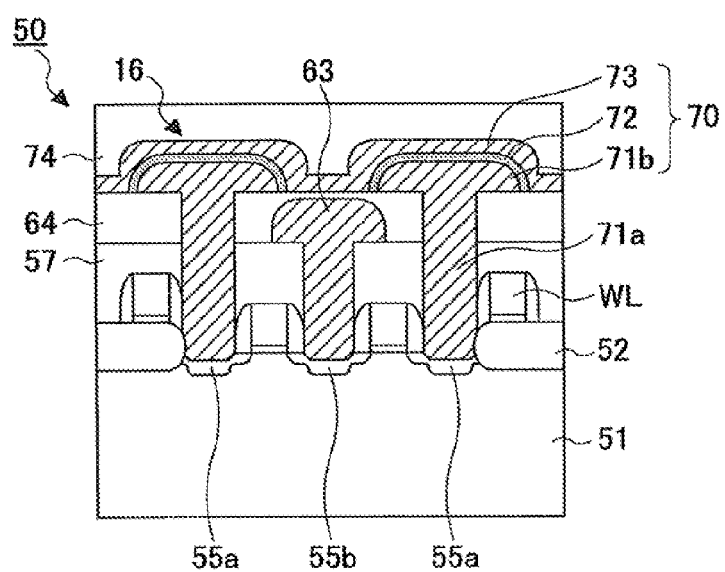

Then, as illustrated in FIG. 8G, n-doped polysilicon is grown in the contact hole 66 and on the interlevel dielectric film 64. The n-doped polysilicon film is patterned into a prescribed shape to form a storage contact plug 71a and a storage electrode (bottom electrode) 71b. Then, a dielectric film 72 and a polysilicon top electrode 73 are deposited to form a capacitor 70. Then, dielectric film 74 is formed, and a semiconductor device 50 is fabricated.

The boundary area between the bitline contact 63 and the impurity diffused region 55b has an anisotropic or inverted trapezoidal cross-section, and the contact resistance is reduced. Similarly, the boundary area between the storage contact 71a and the impurity diffused region 55a also has an anisotropic cross-section, without undercut, and the contact resistance is reduced. In addition, because of titanium introduced in the impurity diffused region 55a, leakage current from the storage node can be reduced. Thus, the semiconductor device 50 has a good contact characteristic, as a whole.

Although, in the above-described example, a heated catalyst containing titanium (Ti) is used, the catalyst may contain other metals with high melting point and silicidation energy at or below 1.8 eV, such as platinum (Pt), cobalt (Co), or nickel (Ni), in place of titanium.

In addition, the gas supplied into the chamber is not limited to hydrogen gas. Any gas with a molecular structure suitable for generating thermally decomposed atomic hydrogen may be used. For example, ammonium (NH$_3$) gas may be supplied in place of hydrogen gas.

The damaged layer removing method of the first and second embodiments may be applied to a storage node using a ferroelectric material. In this case, after the damaged layer is removed, while introducing a metal (such as titanium), the contact hole is filled with a metal, via a barrier metal covering the inner face of the contact hole, to form a contact plug. The contact resistance reducing effect is more conspicuous, and leakage current into the silicon substrate can be reduced more efficiently.

Figure 9A:
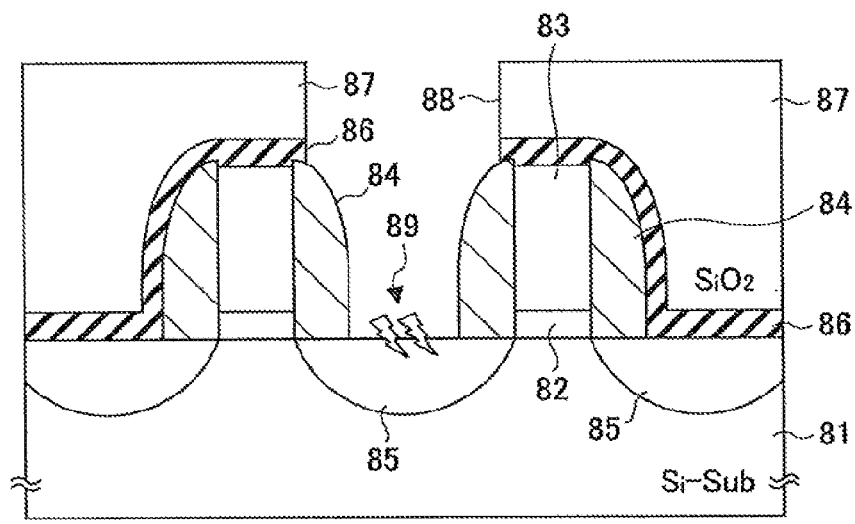
FIG. 9A and FIG. 9B illustrate another applications of removal of damaged layers.
Figure 9B:
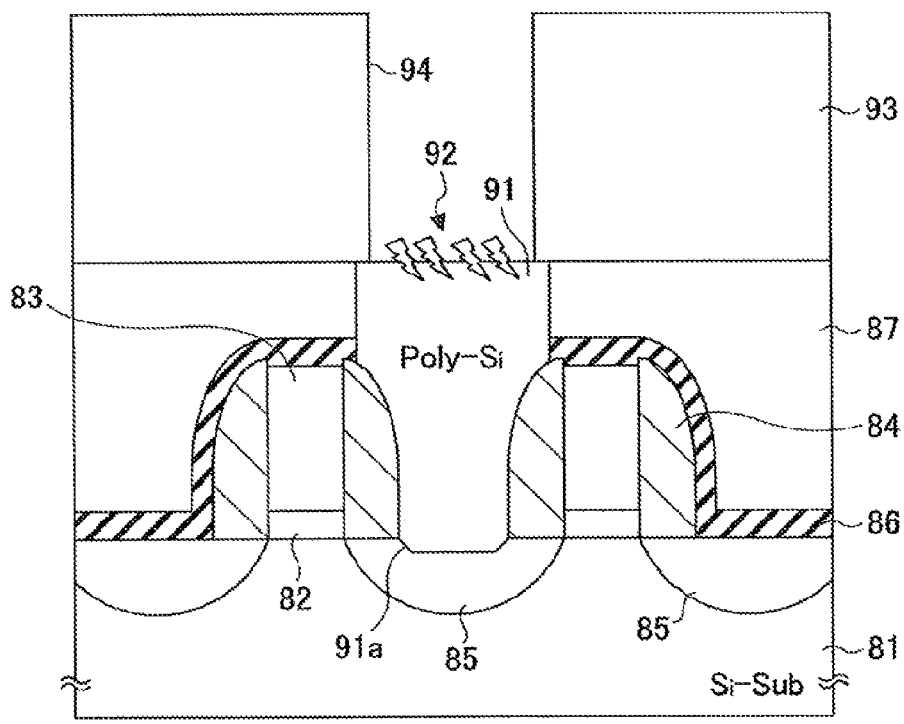

In addition, the damaged layer removing method is applicable to formation of a self-aligned contact (SAC) hole by SAC etching (described in conjunction with FIG. 8A), or formation of a contact hole reaching a polysilicon contact plug, as illustrated in FIG. 9A and FIG. 9B.

FIG. 9A is a schematic diagram illustrating a damaged layer produced when forming a SAC hole. A gate electrode 83 is formed via gate dielectric film 82 on a silicon substrate 81, and an impurity diffused region 85 is formed in the silicon substrate 81. The gate electrode 83 is protected with sidewall 84, and the sidewall 84 and the gate electrode 83 are covered with a nitride film 86 which functions as an SAC etching stopper. The entire surface is then covered with an oxide film 87.

A resist mask (not shown) having an aperture for SAC etching is formed on the oxide film 87. Using a parallel-plate type dual frequency RIE etcher, the steps of
(1) etching oxide film 87;
(2) removing products from nitride film 86; and
(3) etching the nitride film 86 are performed successively to form a self-aligned contact hole 88. For the etching of the oxide film 87 (first step), gas species of $C_4F_8$, CO, Ar, and $O_2$ are used. For the removal of the products (second step), $O_2$ and Ar are used. For the etching of nitride film 86 (third step), $CHF_3$, Ar, and $O_2$ are supplied.

In the third step, carbon ions are injected into the impurity diffused region 85, and a damaged layer (silicon-carbon bond) 89 is produced. The carbon ion energy is about 1.0 keV.

The damaged layer 89 is removed by atomic hydrogen (hydrogen radical). To be more precise, a catalyst is heated to 1800° C. in advance in a processing chamber, in which chamber the pressure and the susceptor temperature are set to 1.33 Pa and 420° C., respectively. Hydrogen gas is supplied into the chamber to generate thermally decomposed atomic hydrogen (hydrogen radicals). The thermally decomposed atomic hydrogen reacts with the silicon substrate and removes the damaged layer 89 from the silicon substrate leaving an inverted trapezoidal cross-sectional profile.

FIG. 9B is a schematic diagram illustrating a damaged layer produced when a contact hole reaching the under-level polysilicon contact plug is formed. In this example, the contact hole 88 formed in FIG. 9A is filled with polysilicon, and polysilicon plug 91 is formed. Then, oxide film 93 is deposited over the entire surface. A contact hole 94 reaching the polysilicon plug 91 is formed in the oxide film 93 by dry etching using a resist mask (not shown). The dry etching is, for example, reactive ion etching (RIE) at discharge frequency of 380 Hz. The etching gas species are, for example, $CHF_3$, $CF_4$, and Ar, and the ion energy is set to 1.2 keV. During the dry etching, carbon ions are driven into the surface of the polysilicon plug 91, and a damaged layer (Si—C bond) 92 is produced. To remove the damaged layer 92, the wafer is placed in a processing chamber with a heated catalyst. Hydrogen gas is supplied into the processing chamber under the conditions of the catalyst temperature of 1800° C., the pressure of 1.33 Pa, and the susceptor temperature of 420° C., to generate thermally decomposed atomic hydrogen (hydrogen radicals). The damaged layer 92, which causes a rise in resistance, is removed from the surface of the polysilicon plug 91 making use of thermally decomposed atomic hydrogen, and consequently, a contact plug with reduced resistance can be realized.

Next, the third embodiment of the present invention is described with reference to FIG. 10 through FIG. 14.

FIG. 10A through FIG. 10I illustrate a semiconductor device fabrication process according to the third embodiment of the invention. In the third embodiment, a damaged layer is removed after the patterning of the gate electrode and after the formation of a sidewall, by atomic hydrogen (hydrogen radicals) generated by thermal decomposition using a heated catalyst.

Figure 10A:
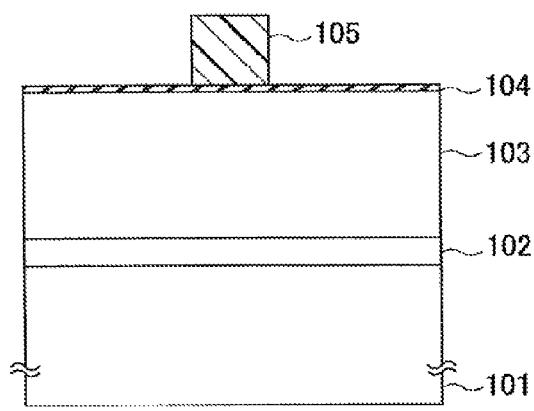
FIG. 10A through FIG. 10I illustrate a semiconductor device fabrication process according to the third embodiment of the invention.
Figure 10B:
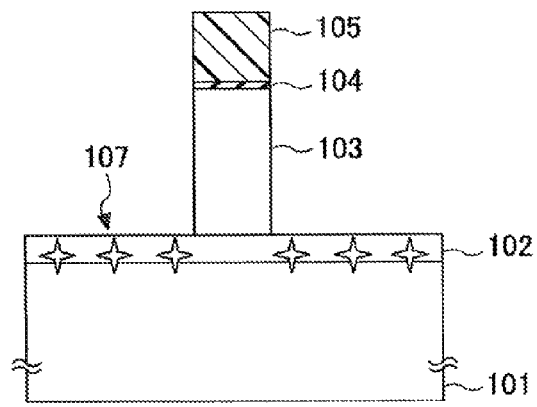

First, as illustrated in FIG. 10A, gate oxide film 102 is formed over the substrate 101 by thermal oxidation, and polysilicon film 103 and antireflective SiN film 104 are deposited by CVD. Then, a resist film is delineated into a prescribed pattern to form a resist mask 105. Then, as illustrated in FIG. 10B, the SiN film 104 and polysilicon film 103 are etched by a dry process. For etching the polysilicon 103, $Cl_2$ and $O_2$ are supplied at 50 SCCM and 10 SCCM, respectively, microwave power and bias power are set to 1000 W and 50 W, respectively, and pressure is set to 3 mTorr. During this dry process, a damaged layer 107 is produced at the surface of the substrate 101 via the gate oxide film 102. The damaged layer 107 is mainly due to electromagnetic waves.

Figure 10C:
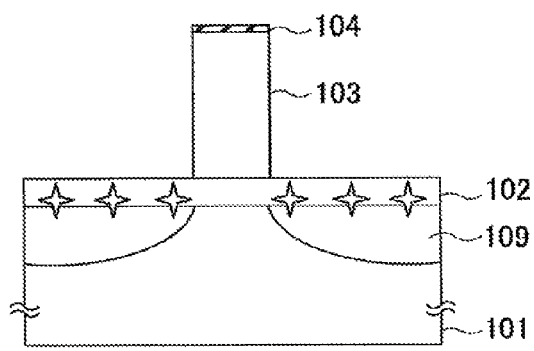

Then, as illustrated in FIG. 10C, the resist mask 105 for polysilicon etching is removed, and another resist mask (not shown) is formed for LDD implantation, and an n-type or p-type impurity is implanted to form LDD regions 109.

Figure 10D:
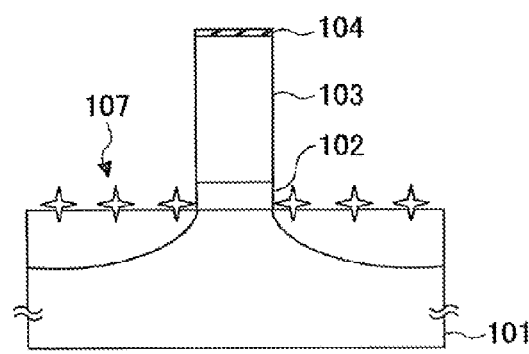

Then, as illustrated in FIG. 10D, the LDD mask resist is removed. To remove the residual resist, hydrofluoric acid treatment is carried out, and the oxide film 102 is also removed from the substrate 101. At this point of time, the damaged layer 107 produced in the gate etching process is exposed.

Figure 10E:
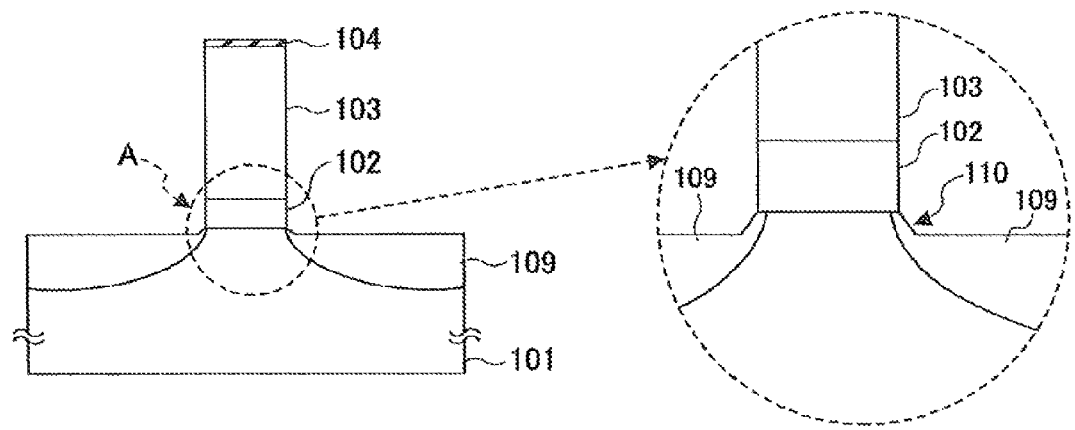

Then, as illustrated in FIG. 10E, the damaged layer 107 is removed by thermally decomposed atomic hydrogen. To generate the thermally decomposed atomic hydrogen, the catalyst placed in the chamber is heated to 1800° C. in advance, the pressure and the susceptor temperature are set to 1.33 Pa and 420° C., respectively, and hydrogen gas is supplied into the chamber. The circled portion A is enlarged in FIG. 10E. After the damaged layer 107 is removed from the LDD region 109, the cross-sectional profile of the surface area becomes tapered or inverted trapezoidal. This arrangement can reduce parasitic resistance and prevent junction leakage due to abnormal creation of metal silicide.

Figure 10F:
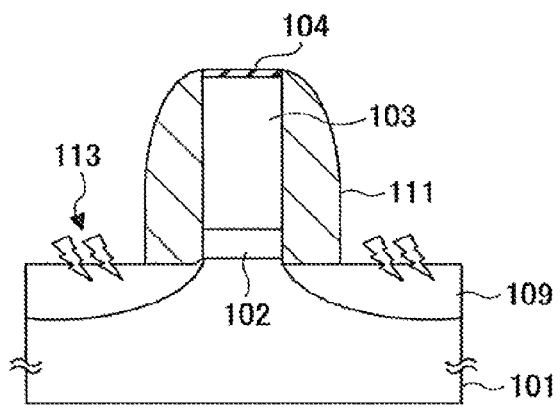

Then, as illustrated in FIG. 10F, oxide film is deposited over the entire surface and dry etching is performed on the oxide film to form sidewall 111. During the sidewall etching, gas species of $CHF_3$, $CF_4$, and Ar are supplied at 100 SCCM, 150 SCCM, and 600 SCCM, respectively, under pressure of 1000 mTorr and applied power of 400 W. Due to the ion implantation in the sidewall etching, damaged layer 113 containing silicon-carbon bond is produced at the surface of the substrate 101 (more particularly, in the LDD region 109).

Figure 10G:
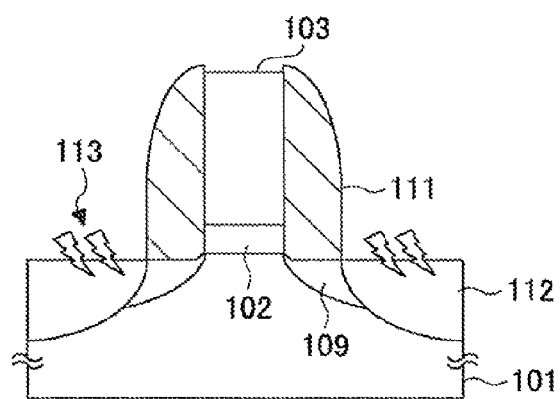

Then, as illustrated in FIG. 10G, the SiN film 104 left on the gate electrode 103 is removed, and a resist mask (not shown) is formed to implant an n-type or p-type impurity to form source and drain regions 112.

Figure 10H:
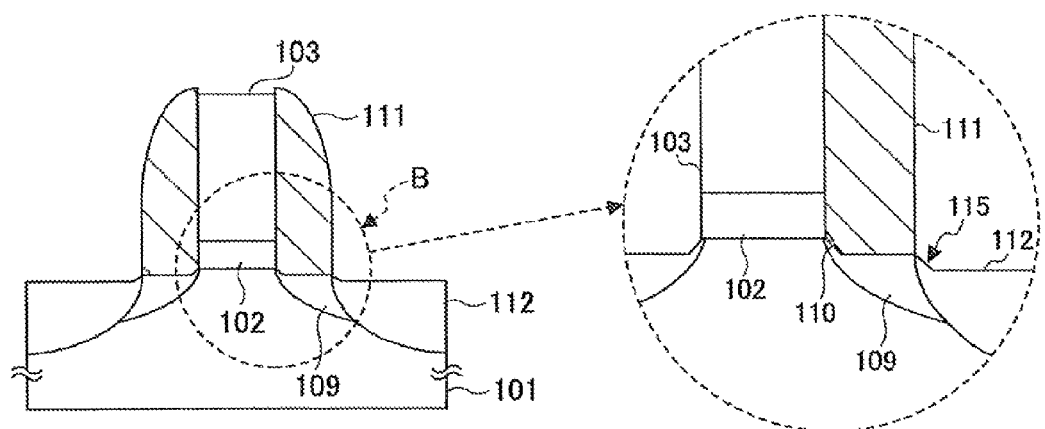

Then, as illustrated in FIG. 10H, the damaged layer 113 is removed by generating thermally decomposed atomic hydrogen using a heated catalyst. The catalyst is heated to 1800° C. in advance, the pressure and the susceptor temperature are set to 1.33 Pa and 420° C., respectively, and hydrogen gas is supplied into the chamber. The circled portion B is enlarged in FIG. 10H. After the damaged layer 113 is removed, the surface area of the source and drain regions 112 exhibits a tapered or inverted trapezoidal cross-sectional profile 115. Consequently, parasitic resistance and junction leakage can be reduced. Evaporated metal particles may be introduced into the subtracted successively after the removal of the damaged layer 113. If a catalyst containing a metal suitable for silicidation with silicidation activation energy at or below 1.8 eV (such as Ti, Co, Pt, or Ni) is used, evaporated metal particles are introduced into the substrate simultaneously with the removal of the damaged layer 113. In this case, a stable amount of metal can be introduced in the substrate in an efficient manner, and junction leakage can be reduced.

Figure 10I:
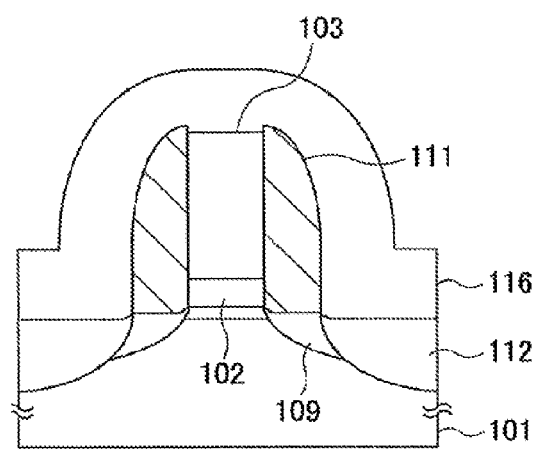

Finally, as illustrated in FIG. 10I, interlevel dielectric film 116 is deposited over the entire surface, and the process proceeds to the subsequent steps.

FIG. 11 and FIG. 12 are schematic diagrams used to explain the applicability of the third embodiment to the recent trend of miniaturization of semiconductor devices.

Figure 11A:
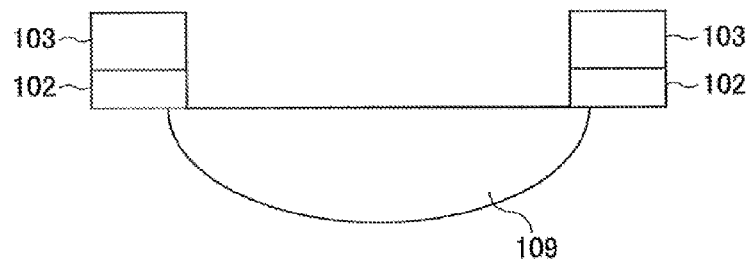
FIG. 11A and FIG. 11B are schematic diagrams for explaining adaptiveness of the present invention to the miniaturization of semiconductor devices.
Figure 11B:
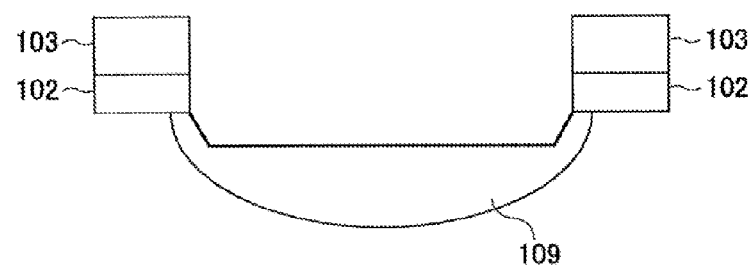

FIG. 11A illustrates formation of LDD region 109 after the patterning of the gate electrode 103, and FIG. 11B illustrates the cross-sectional profile of the device after the surface treatment (removal of the damaged layer) is conducted using thermally decomposed atomic hydrogen. Since damaged silicon produced by gate etching is removed, while leaving a tapered or inverted trapezoidal cross-sectional profile, as illustrated in FIG. 11B, the area for silicidation can be increased without changing the space between the gate electrodes 103. Because of elimination of undercut, junction leakage can be prevented.

Figure 12A:
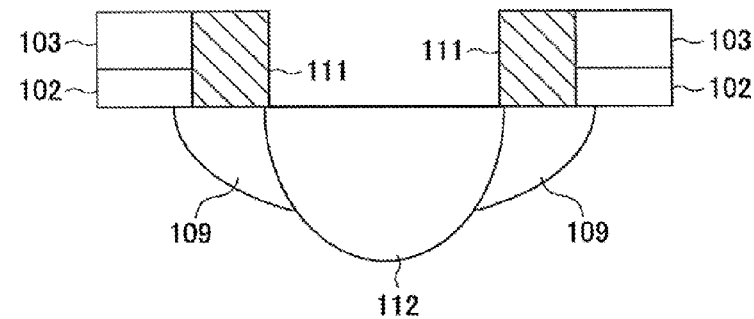
FIG. 12A and FIG. 12B are schematic diagrams for explaining adaptiveness of the present invention to the miniaturization of semiconductor devices.
Figure 12B:
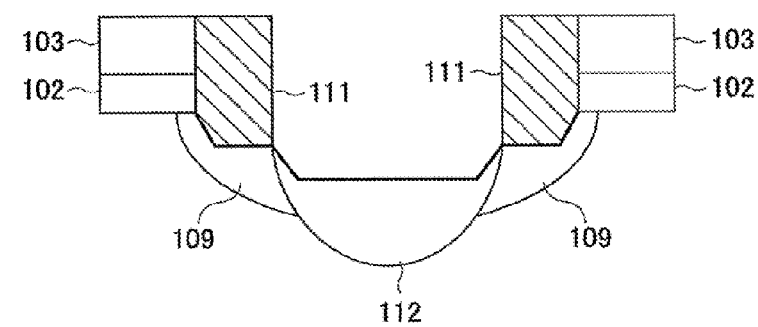

FIG. 12A illustrates source/drain implantation 112 after the sidewall 111 is formed, and FIG. 12B illustrates the cross-sectional profile of the device after the damaged layer produced by the sidewall etching is removed using thermally decomposed atomic hydrogen. Since removal of damaged layer is performed twice, that is, after the gate etching and after the sidewall etching, the cross-section of the surface area between adjacent gate electrodes 102 becomes double tapered (or double inverted-trapezoidal).

Again, the area for silicidation can be increased without changing the space between gate electrodes 103. In general; as the line and space pattern becomes minute, it becomes difficult to form silicide. This problem can be solved by using a catalyst containing a metal with silicidation activation energy at or below 1.8 eV when generating thermally decomposed atomic hydrogen to remove damaged silicon. A stable amount of metal can be introduced in the substrate (in the impurity diffused region), while the area for silicidation is increased by removing the damaged layer. This arrangement is advantageous in fabrication of a minute MOS structure using TiSi or CoSi.

The removal of the damaged layer may be performed either after gate etching or sidewall etching. In this case, parasitic resistance reducing effect and junction leakage preventing effect can be achieved satisfactorily.

FIG. 13A through FIG. 13I illustrate another example of a semiconductor device fabrication process according to the third embodiment of the invention. In this example, removal of damaged silicon using thermally decomposed atomic hydrogen is applied to fabrication of a device array with different thicknesses of gate dielectrics. In an LSI mounting multiple functional blocks, the operational voltage varies depending on the functional blocks. Accordingly, the thickness of the gate oxide film of transistors is designed differently among different blocks.

Figure 13A:
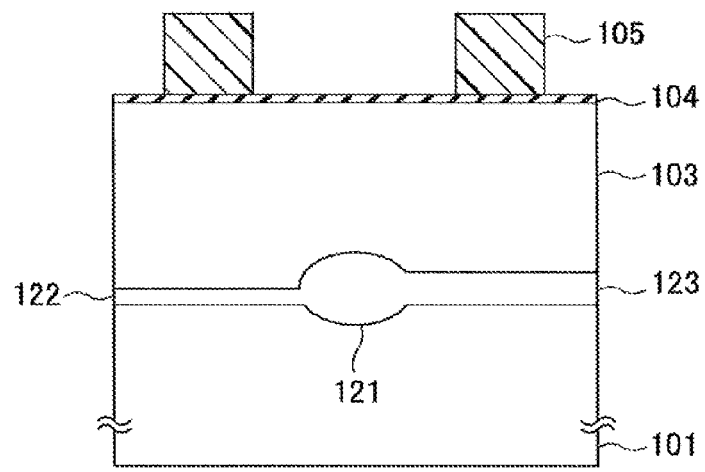
FIG. 13A through FIG. 13I illustrate another example of the semiconductor device fabrication process according to the third embodiment of the invention.

First, as illustrated in FIG. 13A, field isolation 121 and gate oxide films 122 and 123 with different thicknesses are formed by thermal oxidation on the substrate 101. Then, polysilicon film 103 and antireflective SiN film 104 are deposited by a CVD process. Then, resist is patterned into a prescribed shape to form a resist mask 105.

Figure 13B:
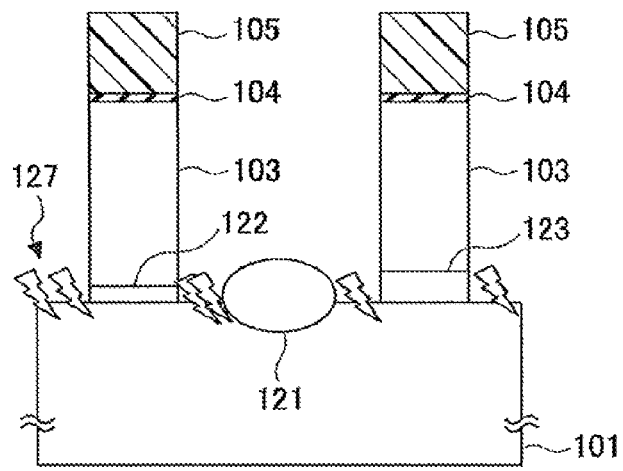

Then, as illustrated in FIG. 13B, the SiN film 104 and polysilicon film 103 are etched by a dry process to form gate electrodes. The etching conditions for polysilicon film 103 are supplying $Cl_2$ and $O_2$ at 50 SCCM and 10 SCCM, respectively, at microwave power of 1000 W and bias power of 50 W, under pressure of 3 mTorr. After the polysilicon etching, the etching conditions are switched to those for oxide etching. For example, $CHF_3$, $CF_4$, and Ar gases are supplied at 100 SCCM, 150 SCCM, and 600 SCCM, respectively, under pressure of 1000 mTorr and applied power of 400 W. In this oxide etching, damaged layer (silicon-carbon bond) 127 is produced on the surface of the substrate 101 due to carbon ion implantation. The damage is conspicuous especially under the thinner gate oxide film 122.

Figure 13C:
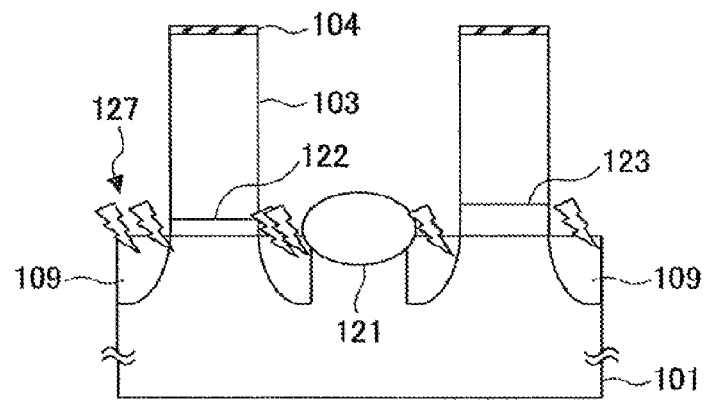

Then, as illustrated in FIG. 13C, resist mask 105 used for polysilicon etching is removed, and another resist mask (not shown) is formed for formation of an LDD region. An n-type or p-type impurity is injected to form LDD region 109.

Figure 13D:
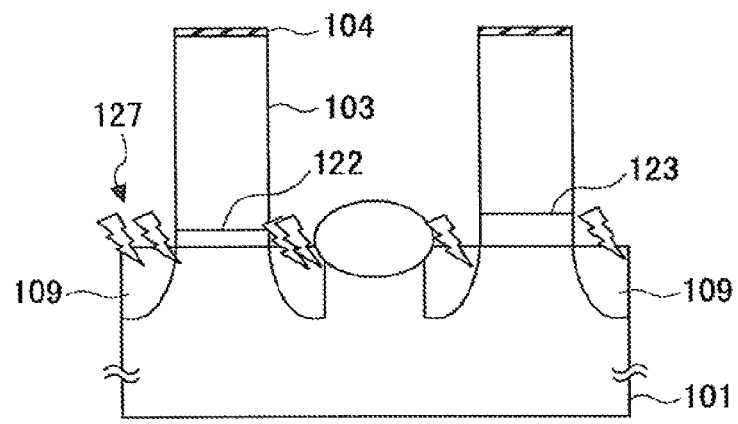

Then, as illustrated in FIG. 13D, the LDD mask resist is removed.

Figure 13E:
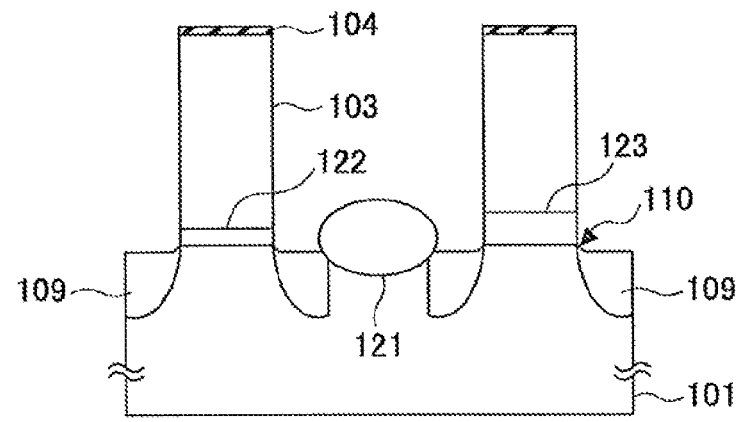

Then, as illustrated in FIG. 13E, damaged layer 127 is removed using thermally decomposed atomic hydrogen (or hydrogen radical), by introducing hydrogen gas so as come into contact with a catalyst heated to 1800° C., under pressure of 1.33 Pa and susceptor temperature of 420° C. After the damaged layer 127 is removed, the surface area of the substrate 101 (more particularly, the LDD region 109) has a tapered or inverted trapezoidal cross-sectional profile. With this arrangement, the area for silicidation increases, and parasitic resistance is reduced. Since the damaged layer can be removed without causing undercut, junction leakage can be prevented.

Figure 13F:
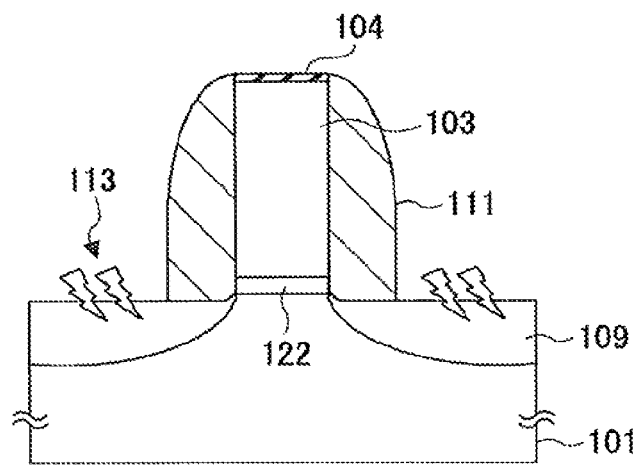

Then, as illustrated in FIG. 13F, oxide film is deposited over the entire surface, and sidewall 111 is formed by dry etching. The etching conditions are supplying $CHF_3$, $CF_4$, and Ar gases at a 100 SCCM, 150 SCCM, and 600 SCCM, respectively, under pressure of 1000 mTorr and applied power of 400 W. In the sidewall etching, damaged layer (silicon-carbon bond) 113 is produced on the surface of the substrate 101 due to carbon ion implantation.

Figure 13G:
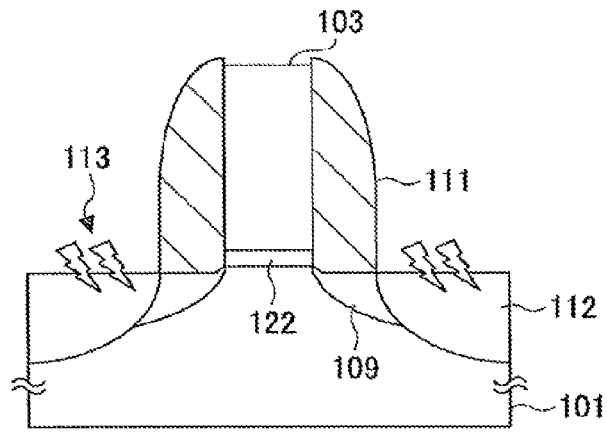

Then, as illustrated in FIG. 13G, the SiN film 104 is removed from the top of the polysilicon gate 103. Then, a resist mask (not shown) is formed for formation of source and drain regions 112, and an n-type or p-type impurity is implanted.

Figure 13H:
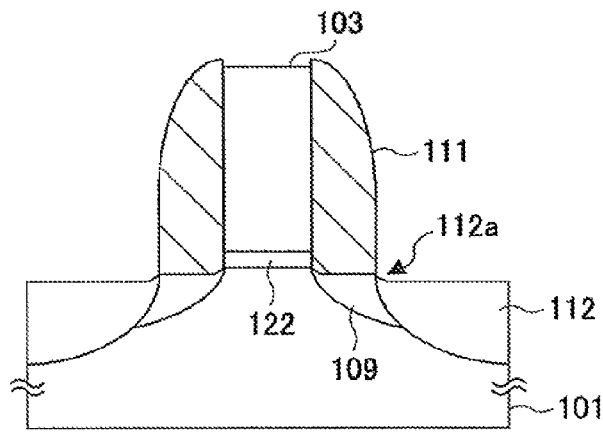

Then, as illustrated in FIG. 13H, damaged layer 113 produced in the sidewall etching is removed using thermally decomposed atomic hydrogen, by introducing hydrogen gas so as to bring it into contact with a heated catalyst of 1800° C., under pressure of 1.33 Pa and susceptor temperature of 420° C. After the removal of the damaged layer 113, the surface area of the source and drain regions 112 has a tapered or inverted trapezoidal cross-sectional profile 112a. Consequently, parasitic resistance is reduced and junction leakage is prevented.

Figure 13I:
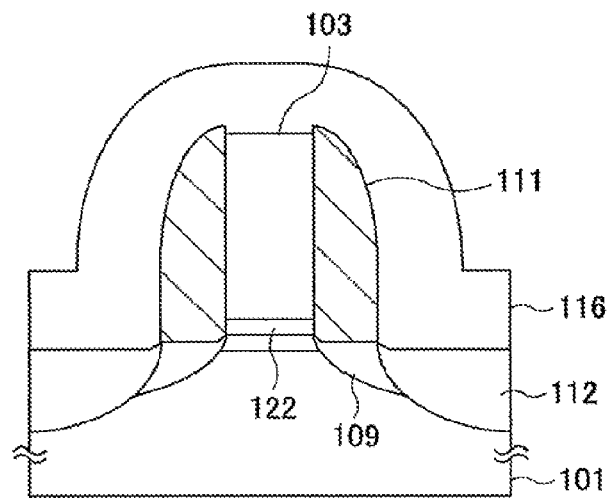

Then, as illustrated in FIG. 13I, interlevel dielectric film 116 is deposited to proceed to the subsequent steps. Although only a single transistor with thinner gate dielectric film 122 is illustrated in FIG. 13F through FIG. 13I, the same process applies to the fabrication process of the transistor with thicker gate dielectric film 123, and the damage layers are removed at once for both types of transistors.

FIG. 14A through FIG. 14H illustrate another example of semiconductor device fabrication process according to the third embodiment of the invention. Removal of damaged layers using thermally decomposed atomic hydrogen (or hydrogen radicals) is again applied to fabrication of devices with different thicknesses of gate dielectric films. In this example, gate dielectric film is etched after sidewalls are formed, unlike the previous example (FIG. 13A through FIG. 13I) in which the gate dielectric film is etched successively after the polysilicon etching.

Figure 14A:
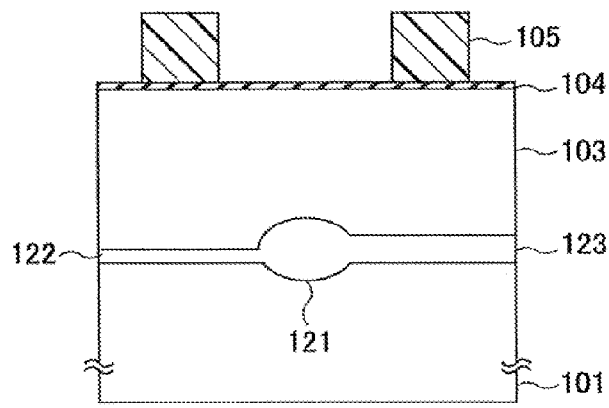
FIG. 14A through FIG. 14H illustrate still another example of the semiconductor device fabrication process according to the third embodiment of the invention.

First, as illustrated in FIG. 14A, field isolation 121 and gate oxide films 122 and 123 with different thicknesses are formed by thermal oxidation on the substrate 101. Then, polysilicon film 103 and antireflective SiN film 104 are deposited by a CVD process. Then, resist is patterned into a prescribed shape to form a resist mask 105.

Figure 14B:
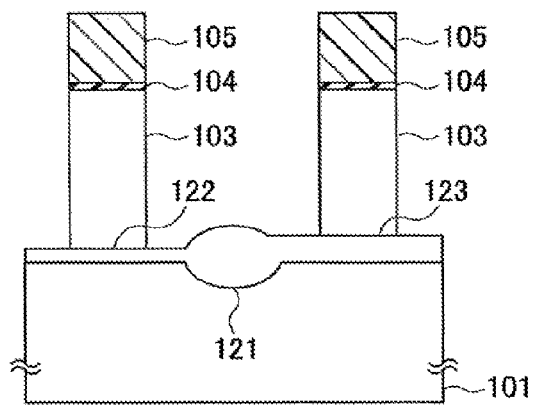

Then, as illustrated in FIG. 14B, the SiN film 104 and polysilicon film 103 are etched by a dry process to form gate electrodes. The etching conditions for polysilicon film 103 are supplying Cl$_2$ and O$_2$ at 50 SCCM and 10 SCCM, respectively, at microwave power of 1000 W and bias power of 50 W, under pressure of 3 mTorr. In this case, the gate oxide films 122 and 123 are left, and therefore, little damage occurs to the substrate 101.

Figure 14C:
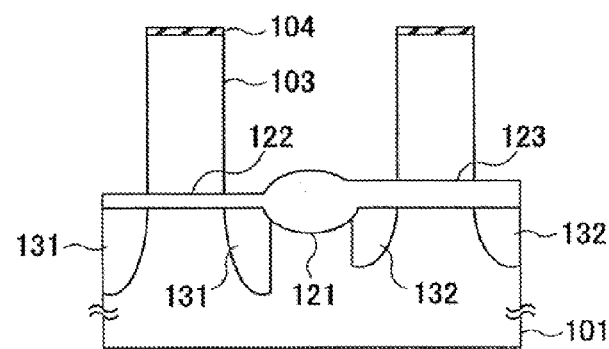

Then, as illustrated in FIG. 14C, the resist mask 105 used for polysilicon etching is removed, and another resist mask (not shown) is formed for formation of LDD regions 131 and 132. An n-type or p-type impurity is injected into the substrate 101 via gate oxide films 122 and 123 with different thicknesses, and LDD regions 131 and 132 have different impurity densities.

Figure 14D:
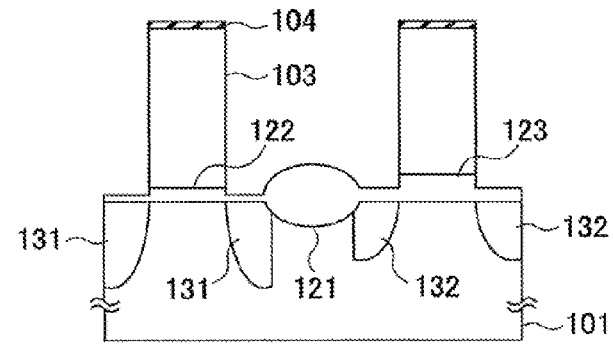

Then, as illustrated in FIG. 14D, the LDD mask resist is removed.

Figure 14E:
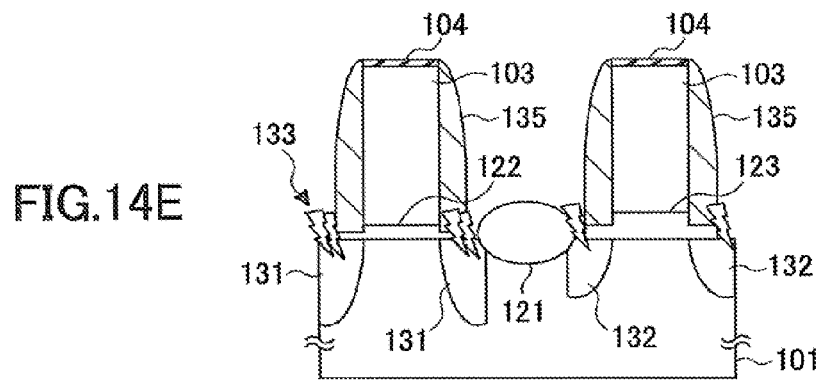

Then, as illustrated in FIG. 14E, oxide film is deposited over the entire surface, and sidewall 135 is formed by dry etching. The etching conditions are supplying CHF$_3$, CF$_4$, and Ar gases at a 100 SCCM, 150 SCCM, and 600 SCCM, respectively, under pressure of 1000 mTorr and applied power of 400 W. In the sidewall etching, damaged layer (silicon-carbon bond) 133 is produced on the surface of the substrate 101 due to carbon ion implantation. The gate oxide films 122 and 123 are also etched by the sidewall etching. Since the dry etching is performed so as not to leave the thicker gate oxide film 123 on the LDD region 132, damage to the substrate 101 is conspicuous in the LDD region 131 located on the side of the thinner gate oxide 122.

Figure 14F:
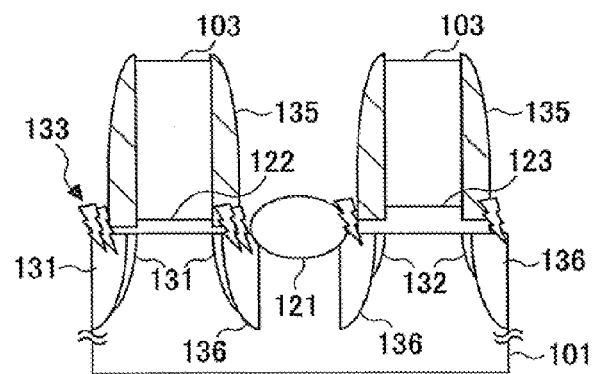

Then, as illustrated in FIG. 14F, the SiN film 104 is removed from the top of the polysilicon gate 103. Then, a resist mask (not shown) is formed for formation of source and drain regions 136, and an n-type or p-type impurity is implanted.

Figure 14G:
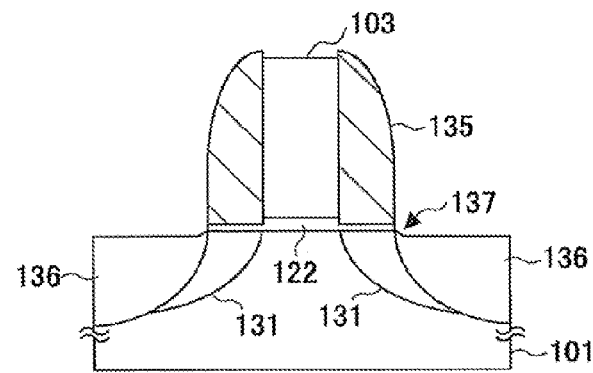

Then, as illustrated in FIG. 14G, damaged layer 133 is removed using thermally decomposed atomic hydrogen, by introducing hydrogen gas so as to bring it into contact with a heated catalyst of 1800° C., under pressure of 1.33 Pa and susceptor temperature of 420° C. After the removal of the damaged layer 133, the surface area of the source and drain regions 136 has a tapered or inverted trapezoidal cross-sectional profile 137. Consequently, parasitic resistance is reduced and junction leakage is prevented.

Figure 14H:
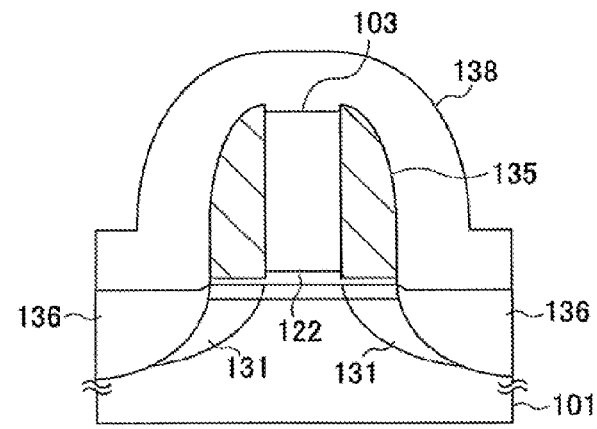

Then, as illustrated in FIG. 14H, interlevel dielectric film 138 is deposited to proceed to the subsequent steps.

In the third embodiment, damaged layers produced in gate etching or sidewall etching can also be removed in an anisotropic (inverted trapezoidal) cross-sectional profile. Consequently, the area for silicidation can be expanded, while preventing abnormal creation of metal silicide at, undercut. Reliable semiconductor devices with low resistance and reduced junction leakage can be fabricated.

Next, the fourth embodiment of the present invention is described with reference to FIG. 15 and FIG. 16. In the fourth embodiment, a logic device 200 with a flash memory is fabricated, as illustrated in FIG. 15A. The semiconductor device 200 includes a primary logic circuit 202, input and output circuits 204, flash memory cells 206, and flash memory cell control circuits 208. The input and output circuit 204 has a PMOS region 204P and NMOS region 204N. Similarly, flash memory cell control circuit 208 has PMOS region 208P and NMOS region 208N.

Figure 15B:
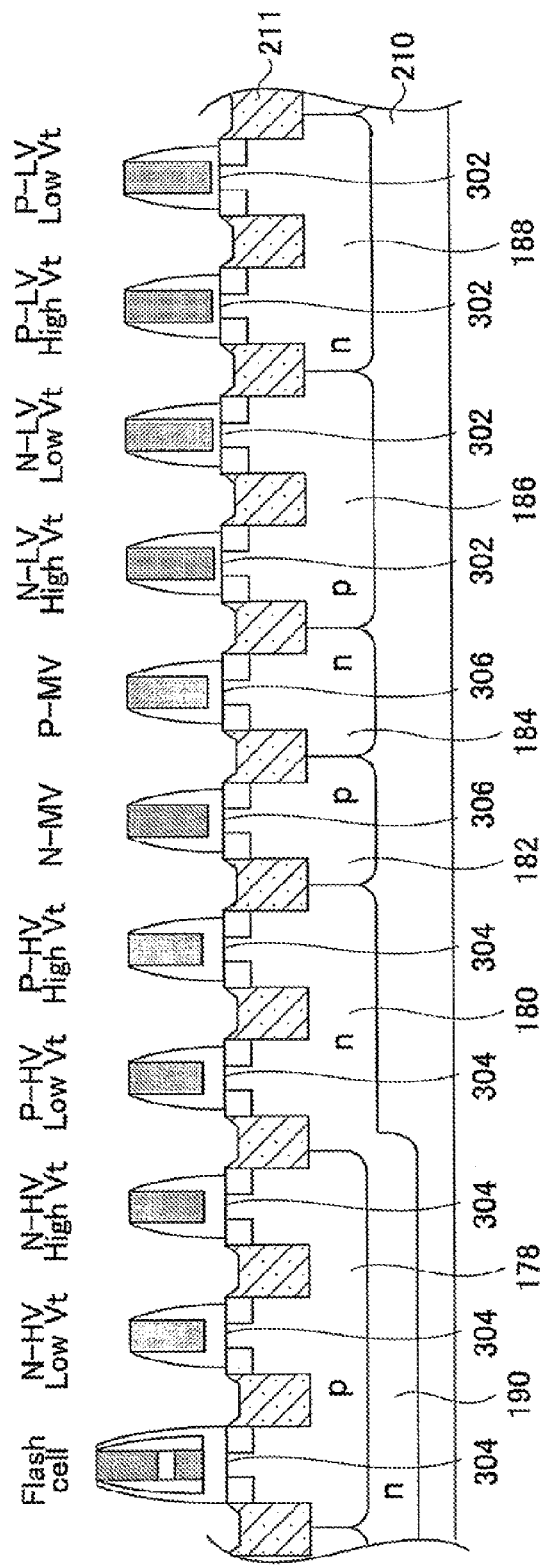

As illustrated in the cross-sectional view of FIG. 15B, semiconductor device 200 has a flash memory cell (Flash cell), an n-channel high-voltage low-threshold-voltage transistor (N-HV Low Vt), and an n-channel high-voltage high-threshold-voltage transistor (N-HV High Vt) formed in the p-well 178 within n-well 190 (double-well structure) of the substrate 210, as well as a p-channel high-voltage low-threshold-voltage transistor (P-HV Low Vt) and a p-channel high-voltage high-threshold-voltage transistor (P-HV High Vt) formed in the n-well 180. These high-voltage transistors are used in the flash memory cell control circuit 208, and have gate dielectric films 304 with the first thickness durable against the readout voltage and write/erase voltage of the flash memory cell.

The semiconductor device 200 also has an re-channel middle-voltage transistor (N-MV) formed in the P-well 182, and a p-channel middle-voltage transistor (P-MV) formed in the n-well 184. These transistors with a middle voltage level are used in the input and output circuit 204, and have the gate dielectric films 306 with the second thickness.

The semiconductor device 200 further has a re-channel low-voltage high-threshold-voltage transistor (N-LV High Vt) and n-channel low-voltage low-threshold-voltage transistor (N-LV Low Vt) formed in the p-well 186, as well as p-channel low-voltage high-threshold-voltage transistor (P-LV High Vt) and p-channel low-voltage low-threshold-voltage transistor (P-LV Low Vt) formed in the n-well 188. These transistors with a low operational voltage are used in the primary logic circuit 202, and have gate dielectric films 302 with the third thickness suitable for high-speed operation.

FIG. 16A through FIG. 16M illustrate a fabrication process of the semiconductor device 200 according to the fourth embodiment of the invention.

Figure 16A:
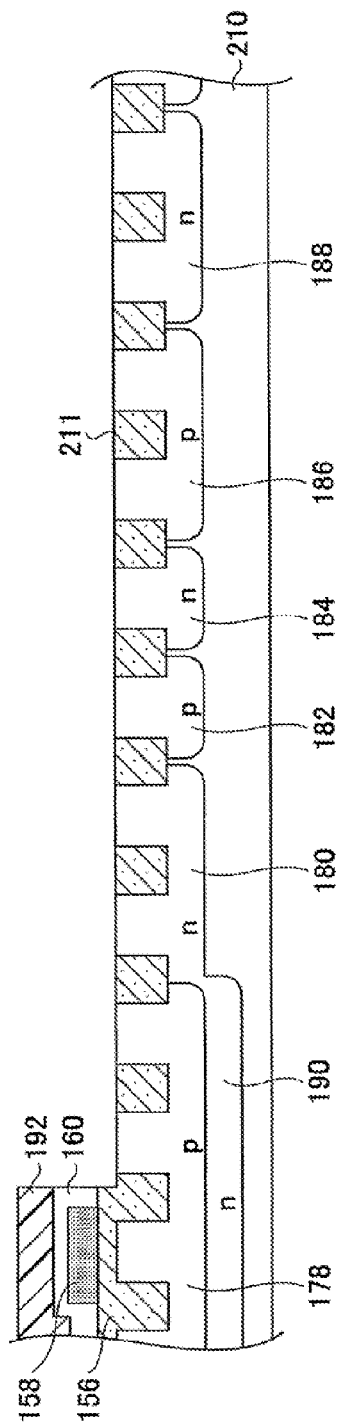

First, as illustrated in FIG. 16A, shallow trench isolation 211 is formed in a prescribed area of the substrate 210, and n-type and p-type impurities are injected into prescribed areas to form the n-well regions 180, 184, 188, and 190 and p-well regions 178, 182, and 186. A tunnel oxide film 156 for the flash memory cell (Flash cell) is deposited, and polysilicon floating gate 158 is formed. Then, oxide-nitride-oxide (ONO) stacked film 160 is formed over the entire surface. A resist mask 192 is formed on the ONO film 160 so as to cover only the flash memory cell and remove the ONO film 160 from the other areas of the substrate 210. Then, the tunnel oxide film 156 is also removed by wet etching from the areas other than the flash memory cell.

Figure 16B:
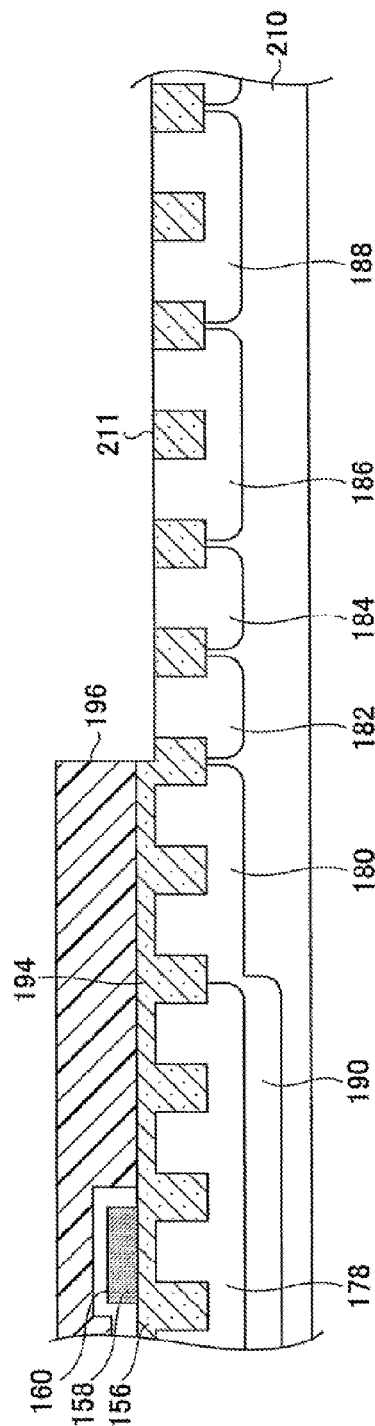

Then, as illustrated in FIG. 16B, the resist mask 192 is removed, and silicon oxide film 194 with thickness of 13 nm is formed in the active region. Then, a resist mask 196 is formed so as to cover the regions of flash memory cell (Flash cell) and high-voltage transistors (N-HV Low Vt, N-HV High Vt, P-HV Low Vt, and P-HV High Vt). Wet etching is performed using the resist mask 196 to remove the silicon oxide film 194 from the regions for middle-voltage transistors (N-MV and P-MV) and low-voltage transistors (N-LV Low Vt, N-LV High Vt, P-LV Low Vt, and P-LV High Vt).

Then, as illustrated in FIG. 16C, the resist mask 196 is removed, and a silicon oxide film 198 with a thickness of 4.5 nm is formed so as to cover the regions for middle-voltage transistors (N-MV and P-MV) and low-voltage transistors (N-LV Low Vt, N-LV High Vt, P-LV Low Vt, and P-LV High Vt). With this film formation, the thickness of the previously formed silicon oxide film 194 also increases. Then, a resist mask 199 is formed so as to expose only the region for the low-voltage transistors (N-LV Low Vt, N-LV High Vt, P-LV Low Vt, and P-LV High Vt), and silicon oxide film 198 is removed from this low-voltage transistor region.

Then, as illustrated in FIG. 16D, the resist mask 199 is removed, and a silicon oxide film with thickness of 2.2 nm is formed by thermal oxidation to form gate oxide film 302 for the low-voltage transistors (N-LV Low Vt, N-LV High Vt, P-LV Low Vt, and P-LV High Vt). By this film formation, the thickness of the previously formed silicon oxide films 194 and 198 also increase, respectively. As a result, gate oxide film 304 with thickness of 16 nm is formed in the high-voltage transistor (N-HV Low Vt, N-HV High Vt, P-HV Low Vt, and P-HV High Vt) region, and gate oxide film 306 with thickness of 5.5 nm is formed in the middle-voltage transistor (N-MV and P-MV) region.

Figures 16E, 16F:
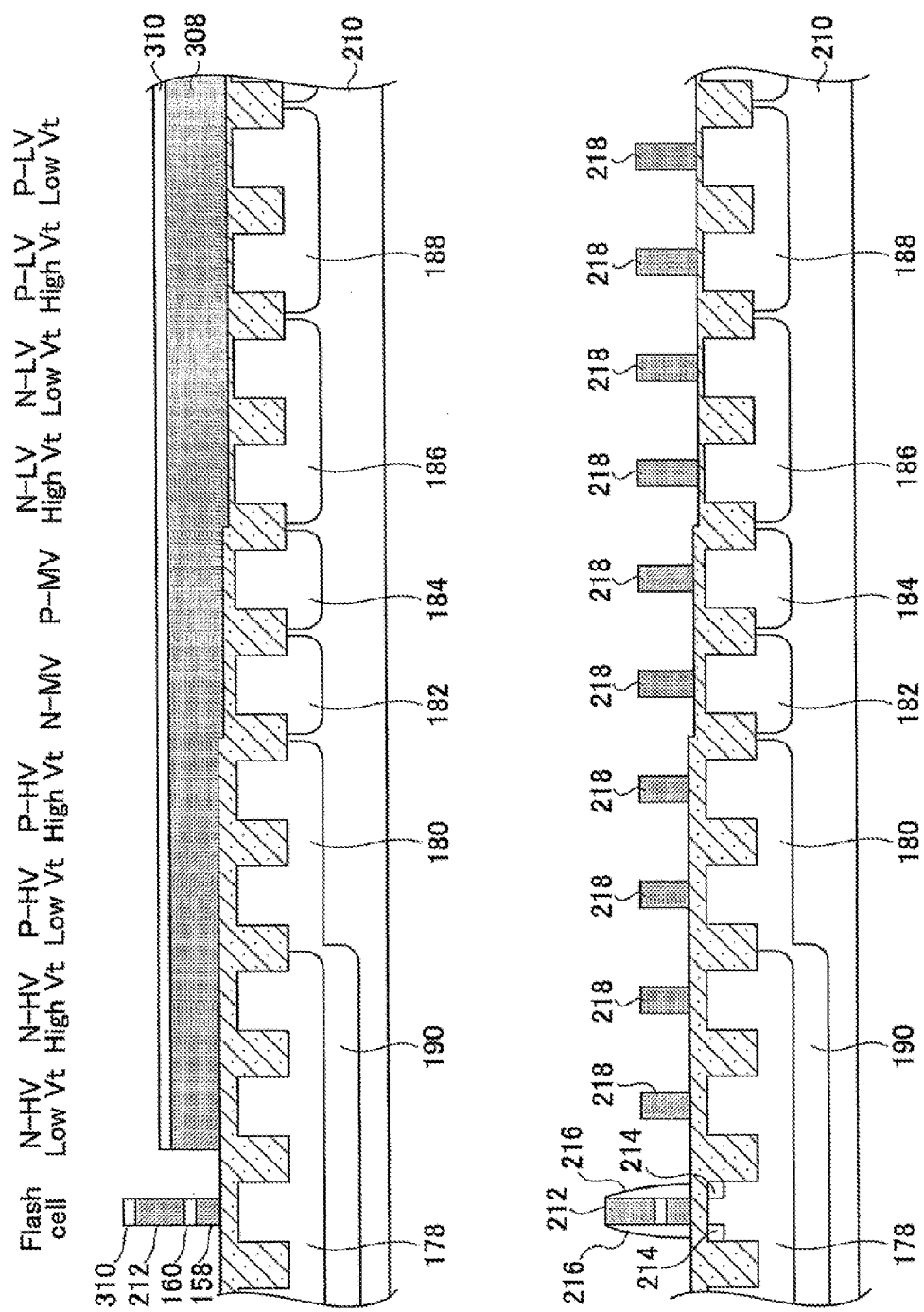

Then, as illustrated in FIG. 16E, polysilicon film 308 is grown by a CVD process, and then a silicon nitride film 310 is grown by plasma CVD on the polysilicon film 308. The silicon nitride film 310 functions as an antireflection film and an etching mask for pattering the underlying polysilicon film 308. The silicon nitride film also serves as a protection cap for protecting the gate electrode when forming a sidewall for the gate electrode of the flash memory cell in the subsequent process. The silicon nitride film 310, polysilicon film 308, ONO stacked film 160, and floating gate 158 are processed by photolithography and dry etching to form gate electrode 212 of the flash memory cell.

Then, as illustrated in FIG. 16F, source and drain region 214 of the flash memory cell (Flash cell) is formed, and side wall 216 of the gate electrode 212 is formed. The polysilicon film 308 of the other transistor areas is also patterned to form gate electrodes 218 in the high-voltage transistor region (for N-HV Low Vt, N-HV High Vt, P-HV Low Vt, and P-HV High Vt), the middle-voltage transistor region (for N-MV and P-MV), and the low-voltage transistor regions (for N-LV Low Vt, N-LV High Vt, P-LV Low Vt, and P-LV High Vt).

Figure 16G:
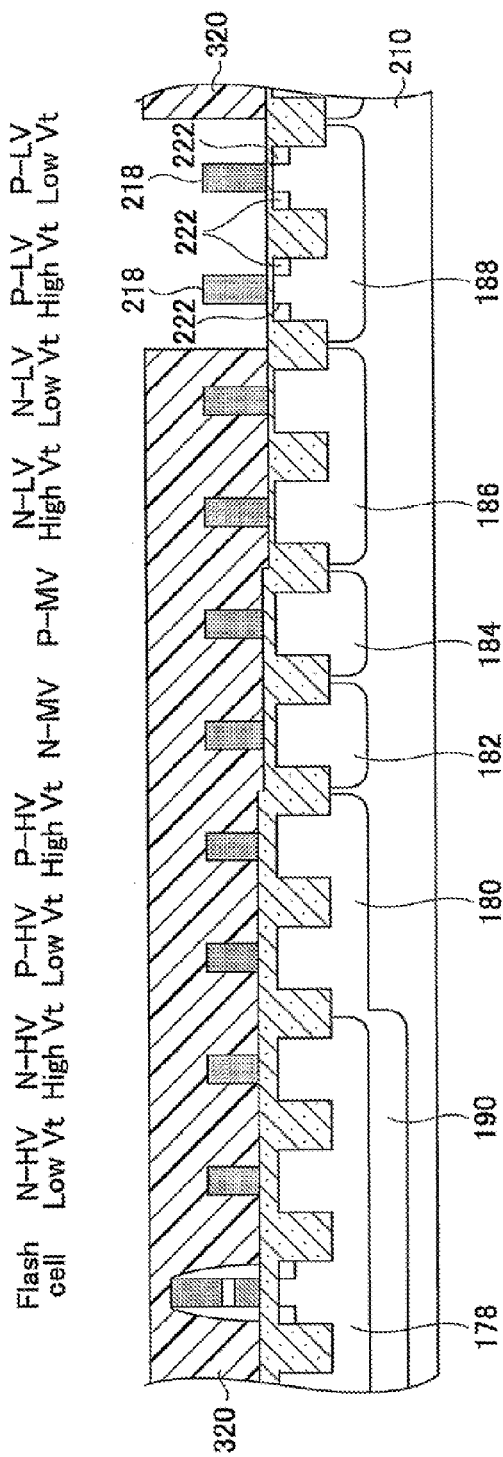

Then, as illustrated in FIG. 16G, resist mask 320 is formed so as to expose only the p-channel low-voltage transistors (P-LV Low Vt and P-LV High Vt), while covering all the other areas, and p-type extension 222 is formed.

Figure 16H:
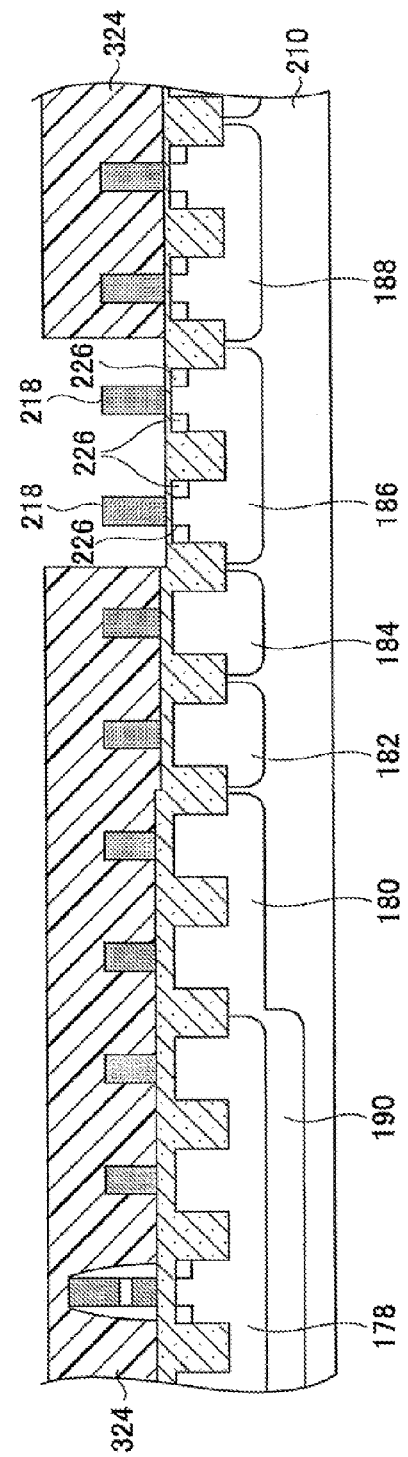

Then, as illustrated in FIG. 16H, the resist mask 320 is removed, and a resist mask 324 is formed so as to expose only the n-channel low-voltage transistors (P-LV Low Vt and P-LV High Vt), while covering all the other areas, and n-type extension 226 is formed.

Figure 16I:
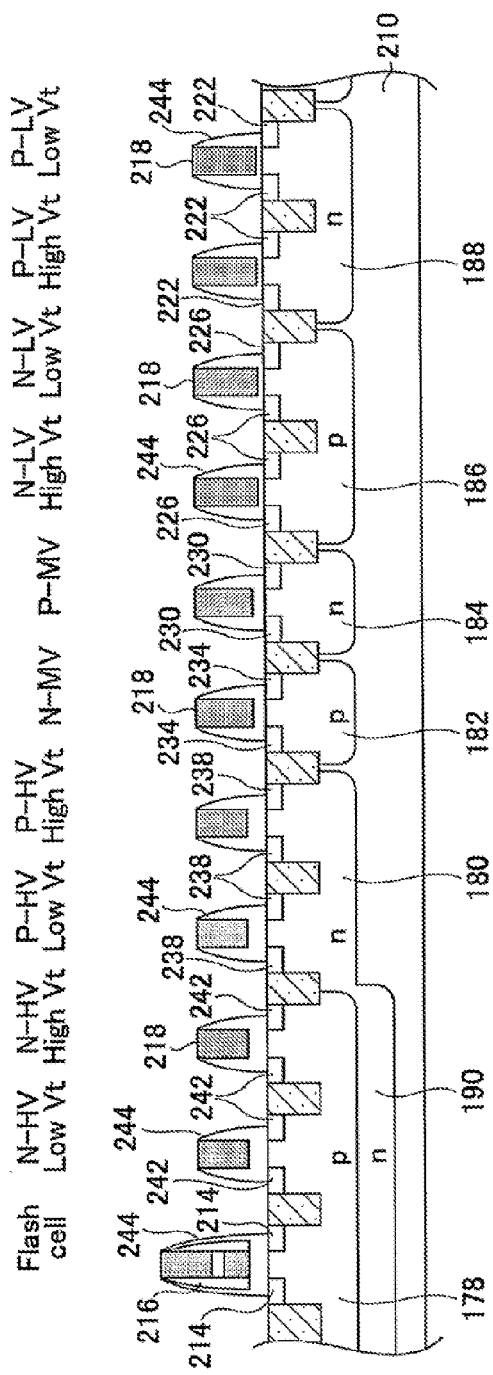

Then, as illustrated in FIG. 16I, p-type extension 230 for the p-channel middle-voltage transistor (P-MV), n-type extension 234 for re-channel middle-voltage transistor (N-MV), p-type extension 238 for the p-channel high-voltage transistors (P-HV Low Vt and P-HV High Vt), and n-type extension 242 for n-channel high-voltage transistors (N-HV Low Vt and N-HV High Vt) are formed successively, in the same manner as illustrated in FIG. 16G and FIG. 16H. The resist mask used for the ion implantation in the last region is removed. Then, silicon oxide film is deposited by a thermal CVD process, and sidewall 244 is formed by etching back the silicon oxide film so as not to leave the gate oxide film. In this sidewall etching, damaged layer (not shown) containing silicon-carbon bond is produced in the surface area of the extension.

Figure 16J:
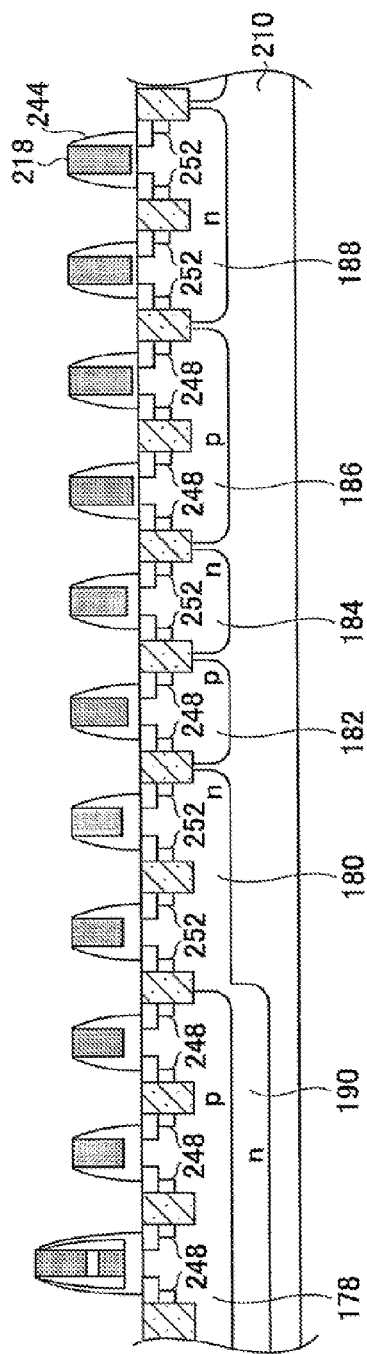

Then, as illustrated in FIG. 16J, p-type source and drain region 248 and n-type source and drain region 252 are successively formed.

Figure 16K:
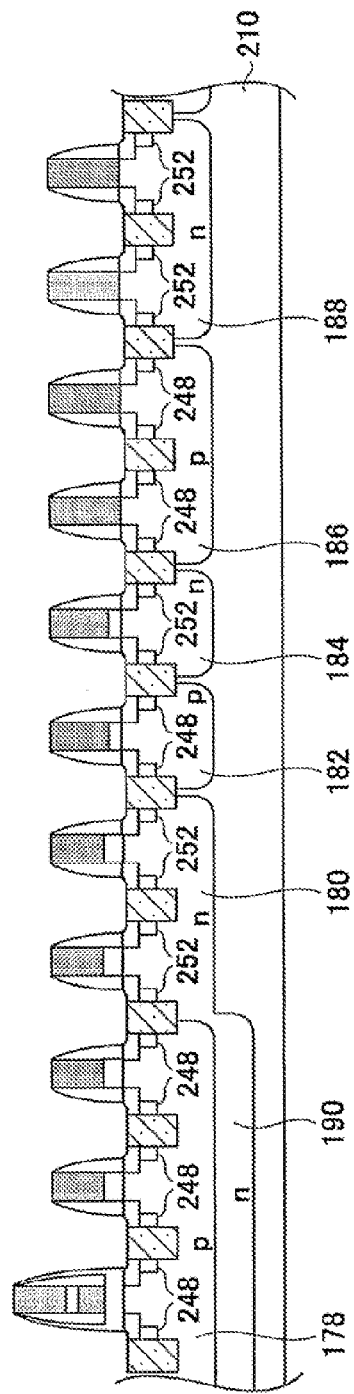

Then, as illustrated in FIG. 16K, the damaged layer produced when forming the sidewall 244 is removed. A catalyst held in a chamber is heated to 1800° C., and hydrogen gas is supplied into the chamber under pressure of 1.33 Pa and susceptor temperature of 420° C., to thermally decompose the hydrogen gas into atomic hydrogen (or hydrogen radicals). The atomic hydrogen (or hydrogen radicals) etches the damaged layer in the source and drain region in an inverted trapezoidal cross-sectional profile. If a metal with silicidation activation energy at or below 1.8 eV is used as the heated catalyst, evaporated metal particles are introduced in the surface of the source and drain regions 248 and 252 during the removal of the damaged layer. In this manner, transistors with different thicknesses of gate oxide films are formed on the substrate 210.

Figure 16L:
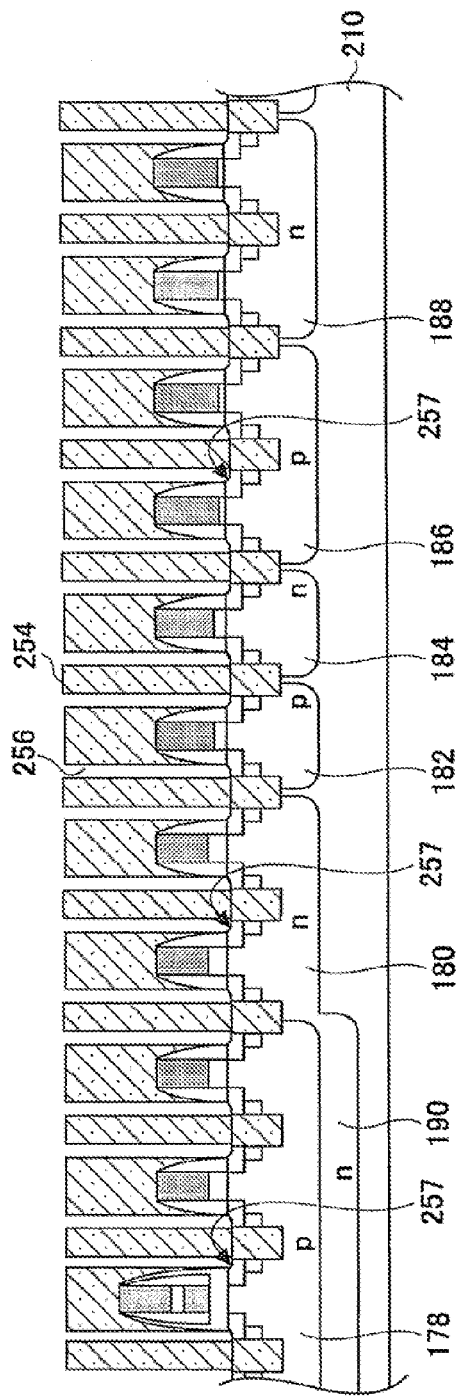

Then, as illustrated in FIG. 16L, dielectric film 254 is deposited over the entire surface, and contact holes 256 reaching the source and drain regions 248 and 252 of the transistors are formed in the dielectric film 254. This contact hole etching is accompanied with carbon ion injection, and a damaged layer (not shown) is produced at the bottom of the contact hole 256 (at the exposed surface of the source and drain regions 248 and 252). Then, the damaged layer is removed by introducing hydrogen gas and thermally decomposing hydrogen gas to generate posed atomic hydrogen (or hydrogen radicals) under the conditions of heated catalyst of 1800° C., 1.33 Pa pressure, and 420° C. susceptor temperature.

Figure 16M:
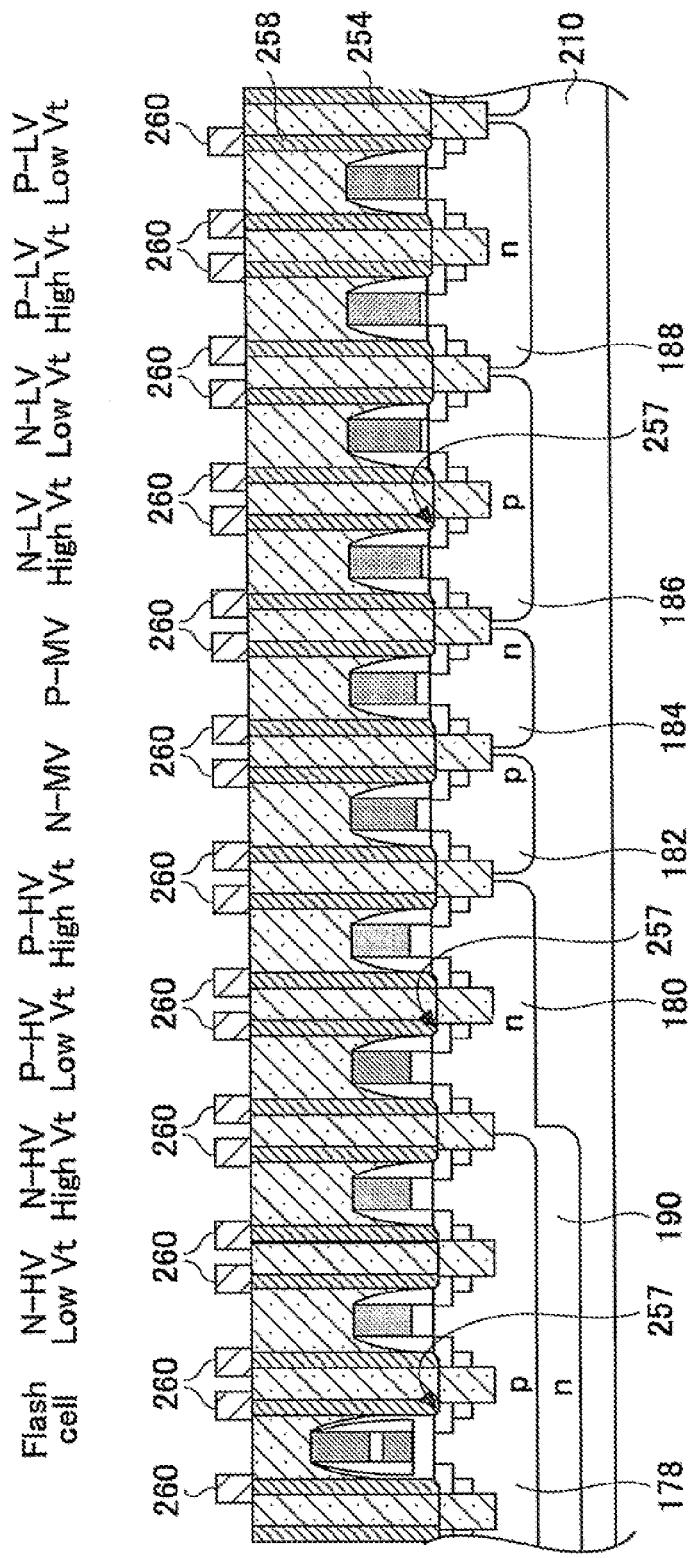

Then, as illustrated in FIG. 16M, the contact hole 256 is filled with a conductive material to form a plug 258, and interconnect 260 of a prescribed pattern is formed on the dielectric film 254. Deposition of interlevel dielectrics and formation of interconnects may be repeated, as necessary, for the upper level structure. Thus, semiconductor LSI device 200 is fabricated.

In the semiconductor device 200, satisfactory device characteristics with reduced resistance and less junction leakage can be achieved in any of the functional blocks.

Although not shown in the figures, the process of forming a contact hole reaching the lower-level polysilicon plug illustrated in FIG. 9B may be incorporated in the semiconductor device fabrication process of the fourth embodiment. In this case, damaged silicon produced on the surface of the polysilicon plug due to contact hole etching is removed by thermally decomposed atomic hydrogen (or hydrogen radicals) using a heated catalyst. Consequently, satisfactory electrical connection with the upper-level interconnect is achieved. In the illustrated example of the fourth embodiment, the damaged layer due to sidewall etching is removed after the source and drain regions are formed. However, the damaged layer due to sidewall etching may be removed before the source and drain regions are formed.

This patent application is based on and claims the benefit of the earlier filing dates of Japanese Patent Application No. 2004-199679 filed Jul. 6, 2004 and No. 2005-042871 filed Feb. 18, 2005, the entire contents of which are incorporated herein by reference.

What is claimed is:

1. A semiconductor device comprising:
a semiconductor substrate;
a gate electrode formed on the semiconductor substrate via a dielectric film;
a sidewall formed on a side surface of the gate electrode; and
an impurity diffused region formed in the semiconductor substrate on both sides of the gate electrode;
wherein the bottom of the sidewall has a first inverted trapezoidal cross-sectional profile, and a surface area of the impurity diffused region extending outside the sidewall has a second inverted trapezoidal cross-sectional profile; and
the first inverted trapezoidal cross-sectional profile and the second inverted trapezoidal cross-sectional profile are located lower than a surface of the semiconductor substrate under the dielectric film.

2. A semiconductor device comprising:
a semiconductor substrate;
a gate electrode formed on a first surface of the semiconductor substrate via a dielectric film;

a sidewall formed on a side surface of the gate electrode; and an impurity diffused region formed in the semiconductor substrate on both sides of the gate electrode, wherein the impurity diffused region includes a second surface which is located lower than the first surface and a third surface which is located between first surface and second surface, a first inner angle of the semiconductor substrate between the first surface and the third surface is an obtuse angle, and a first outer angle of the semiconductor substrate between the second surface and the third surface is an obtuse angle, wherein the impurity diffused region includes a fourth surface which is located lower than the second surface and a fifth surface which is located between the fourth surface and the second surface;

a second inner angle of the semiconductor substrate between the second surface and the fifth surface is an obtuse angle; and a second outer angle of the semiconductor substrate between the fifth surface and the fourth surface is an obtuse angle.

3. The semiconductor device of claim 2, wherein the sidewall is located on the second surface and the third surface.

4. The semiconductor device of claim 2, further comprising:

a contact plug formed on the second surface and the third surface.

* * * * *